United States Patent
Lee et al.

(10) Patent No.: US 12,147,706 B2
(45) Date of Patent: Nov. 19, 2024

(54) STORAGE DEVICE CONTROLLED BY TEMPERATURE DEPENDENT OPERATION COMMANDS

(71) Applicant: SAMSUNG ELECTRONICS CO., LTD., Suwon-si (KR)

(72) Inventors: Kyungduk Lee, Seongnam-si (KR); Younsoo Cheon, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 58 days.

(21) Appl. No.: 17/932,073

(22) Filed: Sep. 14, 2022

(65) Prior Publication Data

US 2023/0176788 A1 Jun. 8, 2023

(30) Foreign Application Priority Data

Dec. 3, 2021 (KR) .................. 10-2021-0172043
Apr. 5, 2022 (KR) .................. 10-2022-0042010

(51) Int. Cl.
*G06F 3/06* (2006.01)

(52) U.S. Cl.
CPC .......... *G06F 3/0659* (2013.01); *G06F 3/0607* (2013.01); *G06F 3/0658* (2013.01); *G06F 3/0679* (2013.01)

(58) Field of Classification Search
CPC .... G06F 3/0659; G06F 3/0607; G06F 3/0658; G06F 3/0679; G06F 13/1668; G11C 16/0483; G11C 16/3418; G11C 7/22; G11C 7/04
See application file for complete search history.

(56) References Cited

U.S. PATENT DOCUMENTS

| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,947,928 B2 | 2/2015 | Kim et al. |

(Continued)

OTHER PUBLICATIONS

EP Extended Search Report Dated Apr. 18, 2023 in Corresponding EP Application No. 22211099.1.

*Primary Examiner* — Khoa D Doan
*Assistant Examiner* — Tong B. Vo
(74) *Attorney, Agent, or Firm* — F. Chau & Associates, LLC

(57) ABSTRACT

A storage device includes nonvolatile memories each including an internal temperature sensor; a memory controller configured having a plurality of operation commands defined for different temperature and an external temperature sensor. The memory controller obtains an external temperature value from the external temperature sensor in a first cycle, obtains an internal temperature value of the internal temperature sensor in a second cycle different from the first cycle, determines a temperature range of a target nonvolatile memory based on the external temperature value when a difference between the external temperature value and the internal temperature value is equal to or less than a first threshold value, to determine the temperature range based on the internal temperature value when the difference exceeds the first threshold, and to provide an operation command corresponding to the temperature range to the target nonvolatile memory.

20 Claims, 13 Drawing Sheets

(56) References Cited

U.S. PATENT DOCUMENTS

| | | | |
|---|---|---|---|
| 9,535,620 B2 | 1/2017 | Kim et al. | |
| 10,115,458 B2 | 10/2018 | Wang | |
| 10,269,399 B2 | 4/2019 | Park et al. | |
| 10,379,784 B1 | 8/2019 | Sethuraman et al. | |
| 2011/0233648 A1 | 9/2011 | Seol et al. | |
| 2014/0372666 A1* | 12/2014 | Moioli | G11C 7/1045 |
| | | | 711/103 |
| 2016/0062656 A1 | 3/2016 | Ramaraju et al. | |
| 2018/0129431 A1 | 5/2018 | Yang et al. | |
| 2018/0293029 A1* | 10/2018 | Achtenberg | G11C 29/028 |
| 2018/0349243 A1* | 12/2018 | Shin | G06F 3/0653 |
| 2020/0301602 A1 | 9/2020 | Kurosawa | |
| 2020/0394114 A1 | 12/2020 | Lee et al. | |
| 2021/0141564 A1* | 5/2021 | Shin | G06F 3/0659 |
| 2021/0158866 A1* | 5/2021 | Sethuraman | G11C 7/04 |
| 2021/0271400 A1* | 9/2021 | Hasegawa | G06F 3/0653 |
| 2021/0397233 A1* | 12/2021 | Nowell | G01K 3/005 |
| 2022/0253242 A1* | 8/2022 | Cresci | G06F 3/0656 |
| 2022/0375510 A1* | 11/2022 | Wu | G06F 11/3058 |

\* cited by examiner

| TEMPERATURE RANGE | PGM | READ | ERASE |
|---|---|---|---|
| R1: −10~0°C | 61h | 81h | 01h |
| R2: 0~10°C | 62h | 82h | 02h |
| R3: 10~20°C | 63h | 83h | 03h |
| R4: 20~30°C | 60h | 80h | 00h |
| R5: 30~40°C | 65h | 85h | 04h |
| DEFAULT (R4) | 60h | 80h | 00h |

FIG. 8A

| TEMPERATURE RANGE | PGM | READ | ERASE |
|---|---|---|---|
| R1: −10~0°C | 61h | 81h | 01h |
| R2: 0~10°C |  | 82h | 02h |
| R3: 10~20°C | 60h | 83h | 03h |
| R4: 20~30°C |  | 80h | 00h |
| R5: 30~40°C |  | 85h | 04h |
| DEFAULT (R4) | 60h | 80h | 00h |

FIG. 8B

| NVM | TEMPERATURE RANGE |
|---|---|
| NVM11 | R2 |
| NVM12 | R2 |
| NVM13 | R2 |
| NVM14 | R4 |
| NVM21 | R2 |
| NVM22 | R2 |
| NVM23 | R3 |
| NVM24 | R3 |

FIG. 9

STORAGE DEVICE CONTROLLED BY TEMPERATURE DEPENDENT OPERATION COMMANDS

CROSS-REFERENCE TO RELATED APPLICATION(S)

This U.S. non-provisional patent application claims priority under 35 USC 119(a) to Korean Patent Application No. 10-2021-0172043 filed on Dec. 3, 2021 and Korean Patent Application No. 10-2022-0042010 filed on Apr. 5, 2022 in the Korean Intellectual Property Office, the disclosures of which are incorporated by reference in their entireties herein.

1. TECHNICAL FIELD

Example embodiments of the present disclosure relate to a storage device.

2. DISCUSSION OF RELATED ART

A semiconductor memory device may include a volatile memory or a nonvolatile memory. The volatile memory loses stored data when power thereto is cut off, whereas the nonvolatile memory retains stored data even when power thereto is cut off. The nonvolatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), or a ferroelectric RAM (FRAM).

Operation characteristics of a nonvolatile memory may vary depending on temperature. Errors may frequently occur when a temperature of the nonvolatile memory at which data is programmed is different from a temperature at the time of reading the data.

SUMMARY

At least one example embodiment of the present disclosure provides a storage device which compensate operation characteristics that vary depending on a temperature of a nonvolatile memory.

At least one example embodiment of the present disclosure provides a storage device that determines a temperature value of a nonvolatile memory and uses the determined temperature to reduce performance degradations thereof.

According to an example embodiment of the present disclosure, a storage device includes a plurality of nonvolatile memories each including an internal temperature sensor; a memory controller configured to communicate with the plurality of nonvolatile memories through a first interface and having a plurality of operation commands defined for temperature ranges of the nonvolatile memories, respectively; and an external temperature sensor configured to communicate with the memory controller via a second interface. The memory controller is configured to obtain an external temperature value from the external temperature sensor in a first cycle, to obtain an internal temperature value of the internal temperature sensor in a second cycle different from the first cycle, to determine a temperature range of a target nonvolatile memory based on the external temperature value when a difference between the external temperature value and the internal temperature value of is equal to or less than a first threshold value, to determine the temperature range based on the internal temperature when the difference exceeds the first threshold value, and to provide an operation command corresponding to the temperature range to the target nonvolatile memory.

According to an example embodiment of the present disclosure, a storage device includes a plurality of nonvolatile memories each including an internal temperature sensor; and a memory controller configured to control the plurality of nonvolatile memories and having a plurality of operation commands defined for temperature ranges of the nonvolatile memories, respectively. The memory controller is configured to determine a temperature range of each of the nonvolatile memories based on a temperature value of the internal temperature sensor. The memory controller is configured to periodically monitor input/output workload of each of the nonvolatile memories, to update a temperature range of a target nonvolatile memory with reference to the internal temperature sensor of the target nonvolatile memory when the amount of the input/output workload is outside a predetermined range in a predetermined time period, to provide an operation command corresponding to the updated temperature range to the target nonvolatile memory among the plurality of nonvolatile memories.

According to an example embodiment of the present disclosure, a storage device includes a plurality of nonvolatile memories; a memory controller configured to control the plurality of nonvolatile memories and having a plurality of operation commands defined for temperature ranges of the nonvolatile memories, respectively; and a channel configured to provide a command latch enable (CLE) signal and an address latch enable (ALE) signal output by the memory controller to a target nonvolatile memory of the plurality of nonvolatile memories. The memory controller is configured to provide, to the target nonvolatile memory, an operation command corresponding to a temperature range to which a temperature value of a target nonvolatile memory among the plurality of nonvolatile memories belongs among the plurality of operation commands in a first time period in which the CLE signal is enabled, to provide an actual address to the target nonvolatile memory in a second time period in which the ALE signal is enabled, and to provide a confirm command to the target nonvolatile memory in a third time period in which the CLE signal is enabled.

BRIEF DESCRIPTION OF DRAWINGS

The above and other aspects and features of the present disclosure will be more clearly understood from the following detailed description, taken in combination with the accompanying drawings, in which:

FIGS. 8A and 8B are diagrams illustrating operation commands according to an example embodiment of the present disclosure;

FIG. 9 is a diagram illustrating a temperature range for each nonvolatile memory according to an example embodiment of the present disclosure;

DETAILED DESCRIPTION

Hereinafter, embodiments of the present disclosure will be described as follows with reference to the accompanying drawings.

Figure 1:
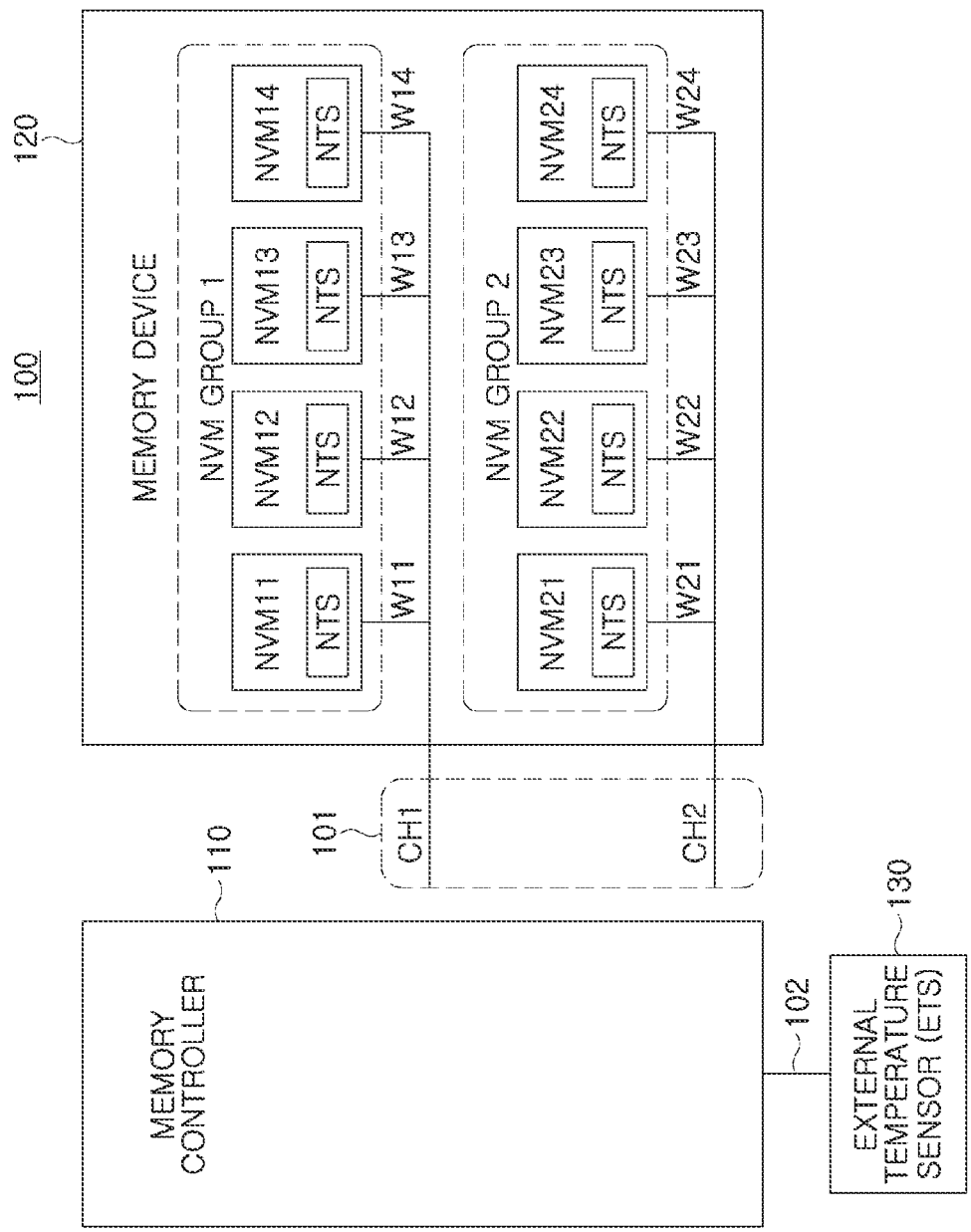
FIG. 1 is a block diagram illustrating a storage device according to an example embodiment of the present disclosure.

FIG. 1 is a block diagram illustrating a storage device according to an example embodiment.

Referring to FIG. 1, the storage device 100 includes a memory controller 110 (e.g., a control circuit), a memory device 120, an external temperature sensor 130 (e.g., a temperature sensing circuit), a first interface 101, and a second interface 102. The memory controller 110 and the memory device 120 may be connected to each other through the first interface 101. Also, the memory controller 110 and the external temperature sensor 130 may be connected to each other through the second interface 102. The external temperature sensor 130 may include one or more temperature sensors.

The memory device 120 may include a plurality of nonvolatile memories NVM11-NVM24. Each of the nonvolatile memories NVM11-NVM24 may be connected to one of the plurality of channels CH1 and CH2 through a corresponding way. For example, the nonvolatile memories NVM11-NVM14 may be connected to the first channel CH1 through the ways W11-W14, and the nonvolatile memories NVM21-NVM24 may be connected to the second channel CH2 through the ways W21-W24. In an example embodiment, each of the nonvolatile memories NVM11-NVM24 may be implemented as an arbitrary memory unit which may operate independently according to an individual command from the memory controller 110. For example, each of the nonvolatile memories NVM11-NVM24 may be implemented as a chip or a die, but examples embodiments thereof are not limited thereto. Also, the number of channels included in the storage device 100 and the number of nonvolatile memories connected to the channels, respectively, are not limited to any particular examples. The nonvolatile memories NVM11-NVM14 connected to the first channel CH1 may be part of a first NVM group and the nonvolatile memories NVM21-NVM24 connected to the second channel CH2 may be part of a second NVM group.

The memory controller 110 may transmit signals to and may receive signals from the memory device 120 through a plurality of channels CH1 and CH2. For example, the memory controller 110 may transmit commands, addresses, and data to the memory device 120 through the channels CH1 and CH2 or may receive data from the memory device 120.

The memory controller 110 may select one of the nonvolatile memories NVM11-NVM24 connected to the corresponding channel through each channel, and may transmit signals to and may receive signals from the selected nonvolatile memory. For example, the memory controller 110 may select the nonvolatile memory NVM11 from among the nonvolatile memories NVM11-NVM24 connected to the first channel CH1. The memory controller 110 may transmit a command, an address, and data to the selected nonvolatile memory NVM11 through the first channel CH1 or may receive data from the selected nonvolatile memory NVM11.

The memory controller 110 may transmit signals to and may receive signals from the memory device 120 in parallel through different channels. For example, the memory controller 110 may, while transmitting a command to the memory device 120 through the first channel CH1, transmit another command to the memory device 120 through the second channel CH2. For example, the memory controller 110 may, while receiving data from the memory device 120 through the first channel CH1, receive other data from the memory device 120 through the second channel CH2.

The nonvolatile memories connected to the memory controller 110 through the same channel may perform an internal operation in parallel. For example, the memory controller 110 may transmit a command and an address to the nonvolatile memories NVM11-NVM14 through the first channel CH1 in sequence. When a command and an address are transmitted to the nonvolatile memories NVM11-NVM14, the nonvolatile memories NVM11-NVM14 may perform an operation according to the command in parallel.

The memory controller 110 may control overall operations of the memory device 120. The memory controller 110 may control each of the nonvolatile memories NVM11-NVM24 connected to the channels CH1 and CH2 by transmitting a signal to the channels CH1 and CH2. For example, the memory controller 110 may control a selected memory among the nonvolatile memories NVM11-NVM14 by transmitting a command and an address to the first channel CH1.

Each of the nonvolatile memories NVM11-NVM24 may operate in response to the control of the memory controller 110. For example, the nonvolatile memory NVM11 may program data according to a command and an address provided to the first channel CH1. For example, the nonvolatile memory NVM21 may read data according to a command and an address provided to the second channel CH2, and may transmit the read data to the memory controller 110.

The nonvolatile memories NVM11-NVM24 may have different operation characteristics according to temperature values of the nonvolatile memories NVM11-NVM24. For example, even when a program operation is performed on the memory cells using the same operation parameter in the nonvolatile memories NVM11-NVM24, distributions of threshold voltage of the memory cells may vary depending on temperature values of the nonvolatile memories NVM11-NVM24 during a program operation. Also, even when a read operation is performed on memory cells having the same threshold voltage using the same operation parameter in the nonvolatile memories NVM11-NVM24, the result of the read operation may vary depending on a temperature value at the time of the program operation of the nonvolatile memories NVM11-NVM24 and a difference in temperature values during the read operation.

When the operation characteristics are compensated according to the temperature value of the nonvolatile memories NVM11-NVM24 measured through a temperature sensor when a program operation or a read operation is performed on the nonvolatile memories NVM11-NVM24, errors in the nonvolatile memories NVM11-NVM24 may be reduced. Each of the nonvolatile memories NVM11-NVM24 may include an internal temperature sensor NTS, and the temperature measured by the internal temperature sensor NTS may be used to determine a temperature value of the nonvolatile memories NVM11-NVM24.

When a large amount of communication between the memory controller 110 and the memory device 120 occurs to compensate the operation characteristics according to temperature values of the nonvolatile memories NVM11-NVM24, performance of the storage device 100 may be reduced. For example, for the memory controller 110 to obtain temperature values of the nonvolatile memories NVM11-NVM24 measured by the internal temperature sensor NTS, it may be necessary to communicate with the nonvolatile memories NVM11-NVM24 using the channels CH1 and CH2. Also, when the memory controller 110 transmits commands and addresses to the nonvolatile memories NVM11-NVM24 through the channels CH1 and CH2, it may be necessary to transmit operation parameters determined according to the temperature values of the nonvolatile memories NVM11-NVM24 together. The processing time for the commands may be delayed by the time taken to transmit the temperature value through the channels CH1 and CH2 and to transmit the operation parameters. That is, the processing time for the command requested by the memory controller 110 may be delayed by the time by which the channels CH1 and CH2 are occupied to transmit the temperature value and the operation parameters.

Accordingly, the storage device 100 may be required to compensate the operation characteristics according to the temperature values of the nonvolatile memories NVM11-NVM24 while reducing performance degradation.

In an example embodiment, different operation commands are defined for each temperature range. In an example embodiment, the memory controller 110 provides, to a target nonvolatile memory, an operation command determined according to a temperature value of a temperature range. The target nonvolatile memory is a target for instructing a command operation or a command. For example, if there is a first operation command associated with a first temperature range and a second operation command associated with a second other temperature range, the first operation command is performed on the target nonvolatile memory when the temperature value is within the first temperature range and the second operation command is performed on the target nonvolatile memory when the temperature value is within the second temperature range. The target nonvolatile memory may perform a command operation using different operation parameters according to the operation command. In an example embodiment, when the memory controller 110 transmits the operation command, the memory controller 110 transmit separate operation parameters according to the current temperature, such that the processing time for the command may be shortened.

In an example embodiment, the storage device 100 may include an external temperature sensor 130 disposed external to the nonvolatile memories NVM11-NVM24. For the memory controller 110 to obtain a temperature value from the internal temperature sensor NTS, the memory controller 110 may need to communicate with a nonvolatile memory through a channel. While the memory controller 110 obtains the temperature value from the nonvolatile memory through the channel, since the memory controller 110 may not transmit a signal to or may not receive a signal from the nonvolatile memory, performance of the storage device 100 may deteriorate.

The memory controller 110 may obtain a temperature value from the external temperature sensor 130 through the second interface 102 separate from the channel. For example, the second interface 102 may transmit/receive a signal between the memory controller 110 and the external temperature sensor 130 through an inter-integrated circuit (I2C) communication. Since the memory controller 110 may transmit a signal to and may receive a signal from the nonvolatile memory even while obtaining the temperature value from the external temperature sensor 130, obtaining of the temperature value from the external temperature sensor 130 may minimally affect performance of the storage device 100.

In an example embodiment, the memory controller 110 estimates the temperature value of the nonvolatile memories NVM11-NVM24 based on the temperature value of the external temperature sensor 130. In an example embodiment, memory controller 110 estimates the temperature values of the nonvolatile memories NVM11-NVM24 based on an input/output workload between the nonvolatile memories NVM11-NVM24. Since the time required to obtain the temperature values of the nonvolatile memories NVM11-NVM24 from the internal temperature sensor NTS through the channels CH1-CH2 may be reduced, performance of the storage device 100 may increase.

Figure 2:
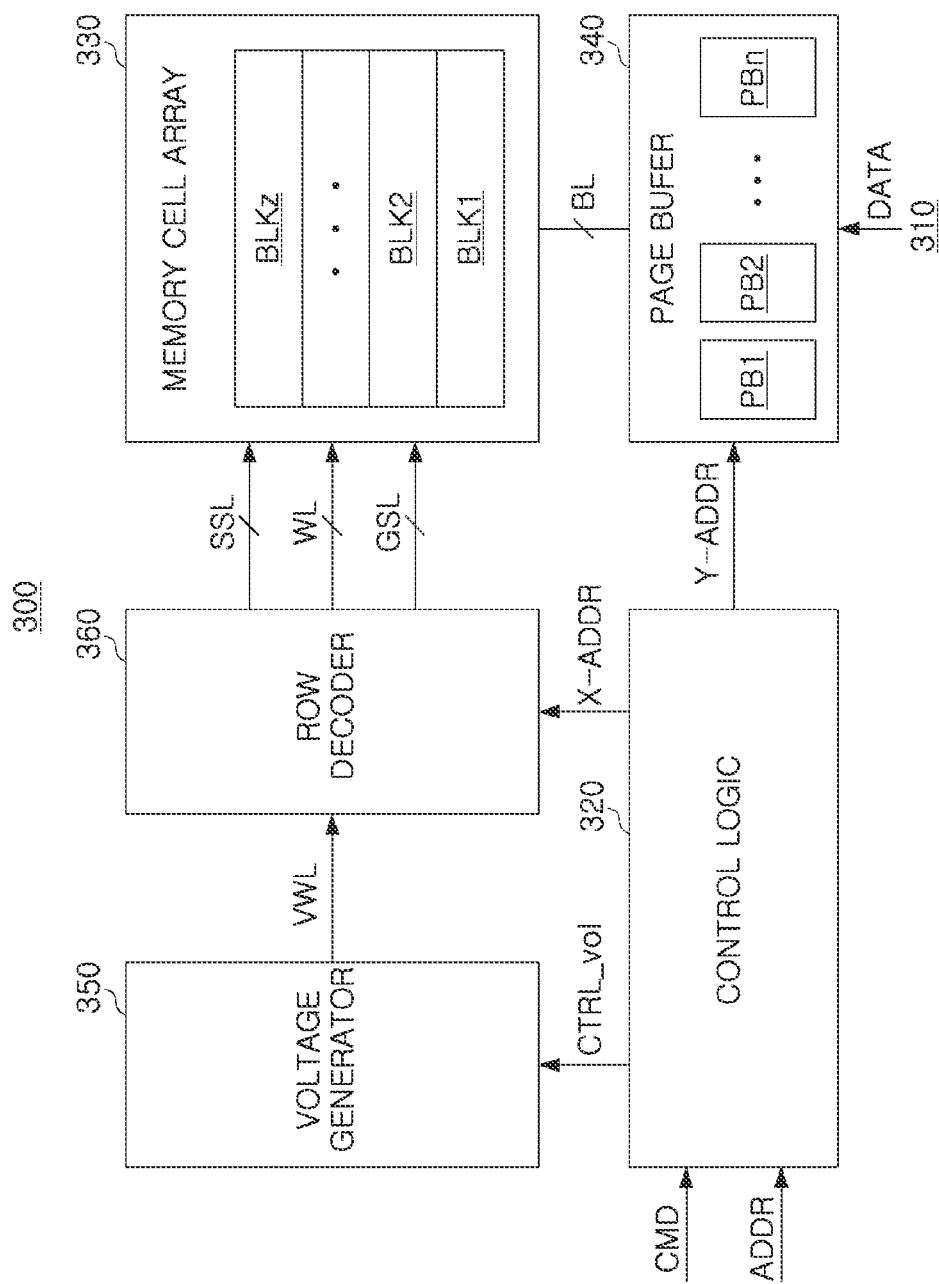
FIGS. 2 to 4 are diagrams illustrating a nonvolatile memory according to an example embodiment of the present disclosure.
Figure 3:
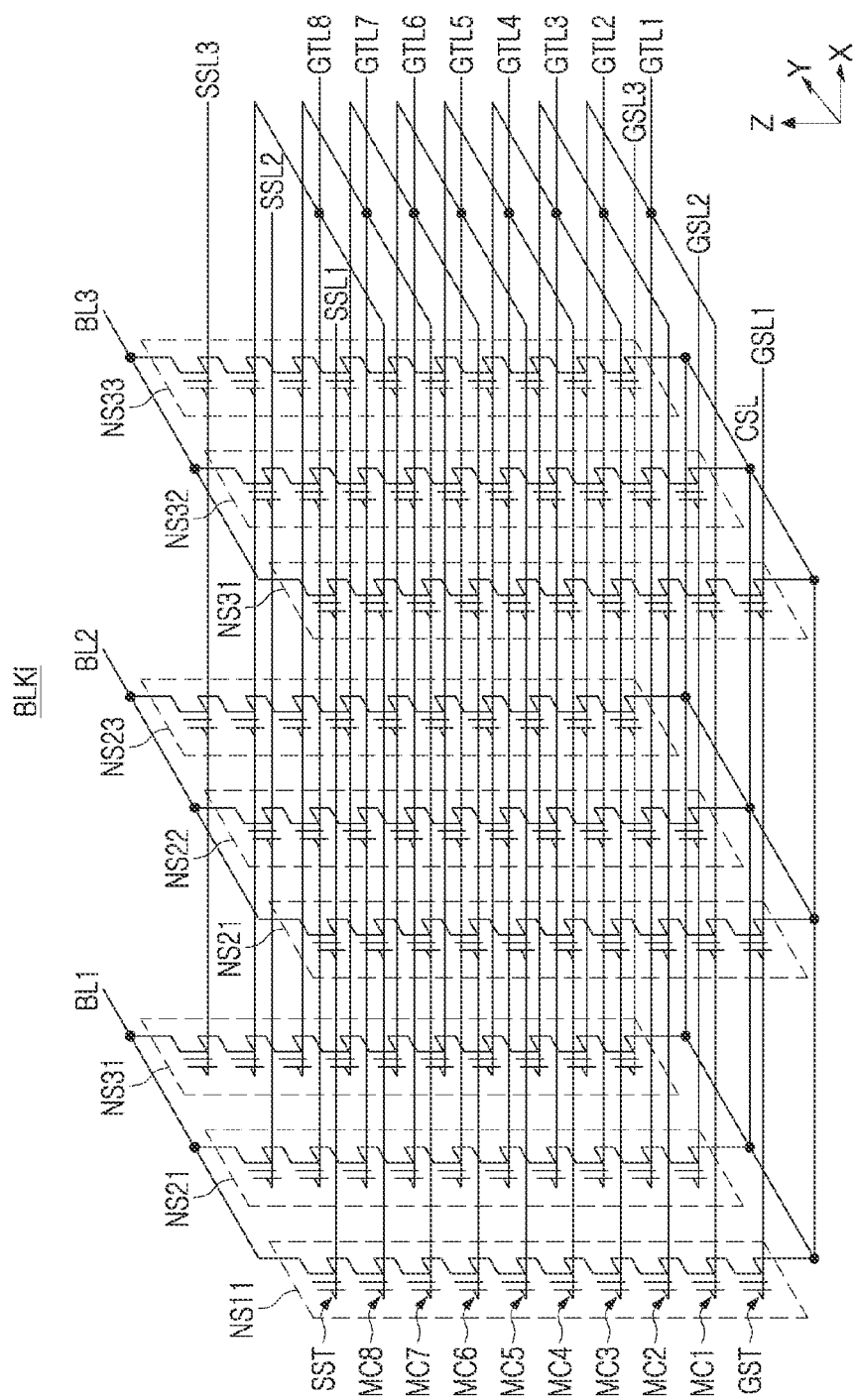
Figure 4:
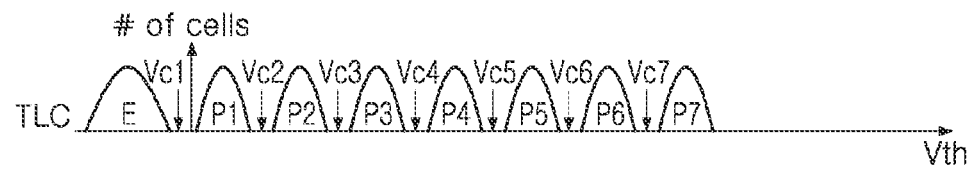

FIGS. 2 to 4 are diagrams illustrating a nonvolatile memory according to an example embodiment.

FIG. 2 is a block diagram illustrating a nonvolatile memory that may be used to implement one of the nonvolatile memories of FIG. 1. Referring to FIG. 2, the nonvolatile memory 300 may include a control logic circuit 320, a memory cell array 330, a page buffer 340, a voltage generator 350, and a row decoder 360 (e.g., a decoder circuit). Although not illustrated in FIG. 2, the nonvolatile memory 300 may further include a memory interface circuit for receiving a command CMD and an address ADDR from an external entity and exchanging data DATA with an external entity, and may further include column logic, a pre-decoder, a temperature sensor, a command decoder, an address decoder, and the like.

The control logic circuit 320 may control various operations in the nonvolatile memory 300. The control logic circuit 320 may output various control signals in response to a command CMD and/or an address ADDR from a memory interface circuit 310. For example, the control logic circuit 320 may output a voltage control signal CTRL_vol, a row address X-ADDR, and a column address Y-ADDR.

The memory cell array 330 may include a plurality of memory blocks BLK1 to BLKz (z is a positive integer), and each of the plurality of memory blocks BLK1 to BLKz may include a plurality of memory cells. The memory cell array 330 may be connected to the page buffer unit 340 through bit lines BL, and may be connected to the row decoder 360 through word lines WL, string select lines SSL, and ground select lines GSL.

In an example embodiment, the memory cell array 330 may include a 3D memory cell array, and the 3D memory cell array may include a plurality of NAND strings. Each NAND string may include memory cells connected to word lines stacked vertically on the substrate, respectively. U.S. Pat. Nos. 7,679,133, 8,553,466, 8,654,587, 8,559,235, and U.S. Patent Application Publication No. 2011/0233648 provides examples of the 3D memory cell array and are incorporated by reference in their entirety herein. In an example embodiment, the memory cell array 330 includes a two-dimensional memory cell array, and the two-dimensional memory cell array may include a plurality of NAND strings arranged in row and column directions.

The page buffer 340 may include a plurality of page buffers PB1 to PBn (n is an integer equal to or greater than 3), and the plurality of page buffers PB1 to PBn may be connected to each of the memory cells, respectively, through a plurality of bit lines BL. The page buffer 340 may select at least one bit line among the bit lines BL in response to the column address Y-ADDR. The page buffer 340 may operate as a write driver or a sense amplifier depending on an operation mode. For example, during a program operation, the page buffer 340 may apply a bit line voltage corresponding to data to be programmed to a selected bit line. During a read operation, the page buffer 340 may sense data stored in the memory cell by sensing a current or voltage of the selected bit line.

The voltage generator 350 may generate various types of voltages for performing program, read, and erase operations based on a voltage control signal CTRL_vol. For example, the voltage generator 350 may generate a program voltage, a read voltage, a program verify voltage, an erase voltage, or the like, as the word line voltage VWL.

The row decoder 360 may, in response to the row address X-ADDR, select one of the plurality of word lines WL and may select one of the plurality of string selection lines SSL. For example, during a program operation, the row decoder 360 may apply a program voltage and a program verify voltage to a selected word line, and during a read operation, the row decoder 360 may apply a read voltage to the selected word line.

FIG. 3 is a diagram illustrating a 3D V-NAND structure applicable to a storage device according to an example embodiment. When the nonvolatile memory of the storage device is implemented as a 3D V-NAND-type flash memory, each of a plurality of memory blocks included in the nonvolatile memory may be represented by an equivalent circuit as illustrated in FIG. 3.

The memory block BLKi illustrated in FIG. 3 may represent a three-dimensional memory block formed on a substrate in a three-dimensional structure. For example, a plurality of memory NAND strings included in the memory block BLKi may be formed in a direction perpendicular to the substrate.

Referring to FIG. 3, the memory block BLKi may include a plurality of memory NAND strings NS11-NS33 connected between the bit lines BL1, BL2, and BL3 and the common source line CSL. Each of the plurality of memory NAND strings NS11-NS33 may include a string select transistor SST, a plurality of memory cells MC1, MC2, . . . , MC8, and a ground select transistor GST. In FIG. 3, each of the plurality of memory NAND strings NS11-NS33 may include eight memory cells MC1, MC2, . . . , MC8, but example embodiments thereof are not limited thereto.

The string select transistor SST may be connected to the corresponding string select lines SSL1, SSL2, and SSL3. The plurality of memory cells MC1, MC2, . . . , MC8 may be respectively connected to corresponding gate lines GTL1, GTL2, . . . , GTL8. The gate lines GTL1, GTL2, . . . , GTL8 may correspond to word lines, and a portion of the gate lines GTL1, GTL2, . . . , GTL8 may correspond to dummy word lines. The ground select transistor GST may be connected to corresponding ground select lines GSL1, GSL2, and GSL3. The string select transistor SST may be connected to the corresponding bit lines BL1, BL2, and BL3, and the ground select transistor GST may be connected to the common source line CSL.

A word line (e.g., WL1) on the same level may be connected in common, and the ground selection lines GSL1, GSL2, GSL3 and the string selection lines SSL1, SSL2, SSL3 may be separated from each other. In FIG. 3 the memory block BLKi may be connected to eight gate lines GTL1, GTL2, . . . , GTL8 and three bit lines BL1, BL2, BL3, but example embodiments thereof are not limited thereto.

The memory block BLKi may have different bit densities according to the number of bits stored by the memory cells included in the memory block BLKi.

FIG. 4 is a graph illustrating distributions of a threshold voltage of a memory cell.

Due to minute differences in electrical properties between the plurality of memory cells, threshold voltages of the memory cells programmed with the same data may form a distribution of threshold voltage of a predetermined range. FIG. 4 illustrates an example of a distribution of threshold voltage which the memory cells may have when the memory cells are configured as triple level cells (TLCs) storing 3-bit data. Referring to FIG. 4, the horizontal axis of the graph may indicate a magnitude of the threshold voltage, and a vertical axis may indicate the number of memory cells.

The memory cell may have a threshold voltage corresponding to one of the erase state E and the first to seventh program states P1 to P7. The first to seventh read voltages Vc1 to Vc7 may be configured as read voltages for distinguishing respective states. For example, when a first read voltage Vc1 is applied to a word line to which the memory cells are connected, a current may smoothly flow through the bit line to which the first memory cells having a lower threshold voltage than the first read voltage Vc1 are connected. That is, the first memory cells may be read as on-cell. No current may flow in the bit line to which the second memory cells having a higher threshold voltage than the first read voltage Vc1 are connected. That is, the second memory cells may be read as off-cells.

When the first read voltage Vc1 is applied to the memory cells, an erase state E may be distinguished from the other states. Similarly, when the second to seventh read voltages Vc2-Vc7 are further applied, both the erase state E and the program states P1-P7 may be distinguished from each other.

Meanwhile, operation characteristics of memory cells may vary according to the temperature of the nonvolatile memory. For example, when a read voltage having the same level is applied to the word line to read memory cells having the same threshold voltage, as the temperature of the nonvolatile memory increases, a greater amount of current may flow through the bit line. Such a change in operation characteristics may affect a result of the read operation of the nonvolatile memory, and may also affect the program operation result accompanying the verify operation performed in a manner similar to the read operation.

Figure 5:
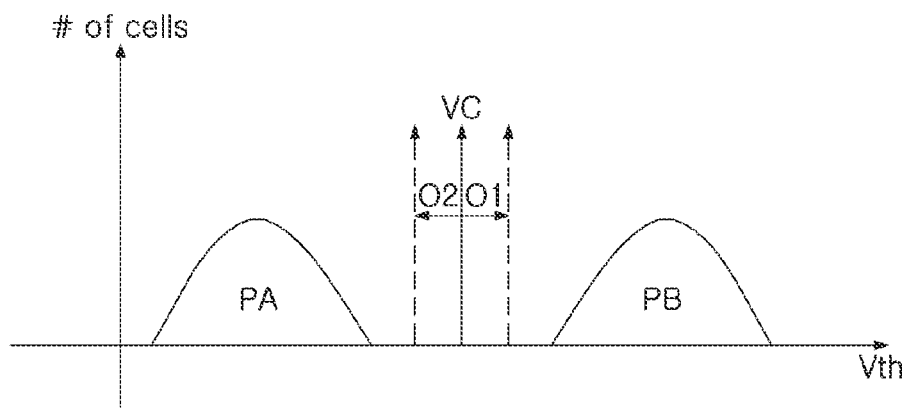
FIG. 5 is a diagram illustrating a read voltage compensated according to a temperature of a nonvolatile memory.

FIG. 5 is a diagram illustrating a read voltage compensated according to a temperature of a nonvolatile memory.

Referring to FIG. 5, the horizontal axis of the graph may indicate the magnitude of the threshold voltage, and the vertical axis may indicate the number of memory cells. FIG. 5 illustrates threshold voltage states PA and PB adjacent to each other and a default level of the read voltage Vc for distinguishing arbitrary two threshold voltage states PA and PB from each other.

When the temperature of the nonvolatile memory increases further than a default temperature, a larger amount of current may flow through the bit line, and memory cells of which a threshold voltage is higher than the default level of the read voltage Vc may be incorrectly read as on-cells. Accordingly, when the temperature of the nonvolatile memory is higher than the default temperature, an operation characteristic varying depending on the temperature of the nonvolatile memory may be compensated by applying the read voltage Vc to which the first offset O1 is reflected to the default level. For example, an offset voltage may be added to the read voltage Vc to increase a level of the read voltage Vc when the temperature of the nonvolatile memory is higher than the default temperature. When the temperature of the nonvolatile memory is lower than the default temperature, a smaller amount of current may flow through the bit line, and memory cells having a threshold voltage lower than the default level of the read voltage Vc may be incorrectly read as off-cells. Accordingly, when the temperature of the nonvolatile memory is lower than the default temperature, the operation characteristic may be compensated by applying the read voltage Vc to which the second offset O2 is reflected to the default level. For example, an offset voltage may be subtracted from the read voltage Vc to decrease a level of the read voltage Vc when the temperature of the nonvolatile memory is lower than the default temperature.

In an example embodiment, operation commands varying depending on a temperature range may be defined. The memory controller may transmit an operation command corresponding to a temperature range to which a temperature value of the target nonvolatile memory belongs to the target nonvolatile memory. The target nonvolatile memory may perform an operation using different operation parameters depending on temperature by interpreting the operation command. For example, the memory controller may determine an offset voltage from a one of the operation parameters stored within a received operation command for adjusting a read, a write/program, or erase voltage. Accordingly, the operation characteristic of the nonvolatile memory varying according to the temperature may be compensated. For example, the memory cells of the nonvolatile memory may have a uniform distribution of threshold voltage regardless of the temperature at which the memory cells of the nonvolatile memory are programmed. Also, when the memory controller 110 instructs a read operation to the target nonvolatile memory, the memory controller 110 may transmit an operation command determined with reference to the temperature of the nonvolatile memory when the memory cells are read, instead of calculating the difference between the temperature of when the memory cells are programmed and the temperature of when the memory cells are read each time, such that data may be read without errors.

Hereinafter, a method of transmitting an operation command to a nonvolatile memory of a memory controller according to an example embodiment will be described in greater detail with reference to FIGS. 6 to 8B.

Figure 6:
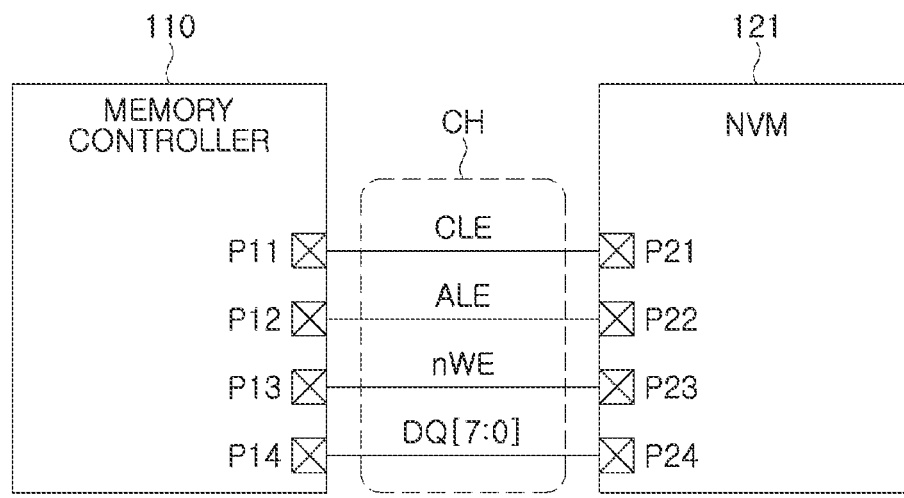
FIG. 6 is a diagram illustrating a channel connecting a memory controller to a nonvolatile memory.

FIG. 6 is a diagram illustrating a channel connecting a memory controller to a nonvolatile memory.

Referring to FIG. 6, the storage device 100 may include a memory controller 110, a target nonvolatile memory 121, and a channel CH. The memory controller 110 in FIG. 6 may correspond to the memory controller 110 described with reference to FIG. 1. Also, the target nonvolatile memory 121 in FIG. 6 may be configured as a nonvolatile memory to which the memory controller 110 instructs an operation, and may correspond to one of the nonvolatile memories NVM11-NVM24 in FIG. 1. Also, the channel CH in FIG. 6 may correspond to one of the channels CH1 and CH2 in FIG. 1.

The memory controller 110 may include eleventh to fourteenth pins P11-P14. The target nonvolatile memory 121 may include 21st to 24th pins P21-P24. The 11th to 14th pins P11-P14 and the 21st to 24th pins P21-P24 may correspond to each other. The memory controller 110 and the target nonvolatile memory 121 may transmit/receive signals through the 11th to 14th pins P11-P14 and the 21st to 24th pins P21-P24.

The memory controller 110 may transmit a command latch enable (CLE) signal, address latch enable (ALE) signal, and write enable (nWE) signal through the 11th to 13th pins P11-P13. Also, the memory controller 110 may transmit a data signal DQ[7:0] to the target nonvolatile memory 121 through the 14th pin P14 or may receive the data signal DQ[7:0] from the target nonvolatile memory 121.

The target nonvolatile memory 121 may receive the CLE signal, the ALE signal, and the nWE signal from the memory controller 110 through the 21st to 23rd pins P21-P23. The target nonvolatile memory 121 may receive the data signal DQ[7:0] from the memory controller 110 through the 24th pin P24 or may transmit the data signal DQ[7:0] to the memory controller 110. The command CMD, the address ADDR, and the data DATA may be transmitted through the data signals DQ[7:0]. The data signals DQ[7:0] may be transmitted through a plurality of data signal lines. In this case, the 24th pin P24 may include a plurality of pins corresponding to a plurality of data signal lines.

The target nonvolatile memory 121 may receive a command CMD from the data signal DQ[7:0] received in an enable period (e.g., a high level state) of the CLE signal based on toggle timings of the nWE signal. The target nonvolatile memory 121 may receive an address ADDR from a data signal DQ[7:0] received in the enable period (e.g., a high level state) of the ALE signal based on toggle timings of the nWE signal.

In an example embodiment, the nWE signal may maintain a fixed state (e.g., a high level or a low level) and may toggle between a high level and a low level. For example, the nWE signal may be toggled in a period in which a command CMD or an address ADDR is transmitted. Accordingly, the target nonvolatile memory 121 may obtain the command CMD or the address ADDR based on the toggle timings of the nWE signal.

The memory controller 110 may transmit the data signal DQ[7:0] including the command CMD or the address ADDR to the target nonvolatile memory 121 together with the toggle nWE signal. When the memory controller 110 transmits the CLE signal having the enable state, the memory controller 110 may transmit the data signal DQ[7:0] including the command CMD to the target nonvolatile memory 121, and when the memory controller 110 transmits the ALE signal having an enable signal, the memory controller 110 may transmit the data signal DQ[7:0] including the address ADDR to the target nonvolatile memory 121.

Figure 7A:
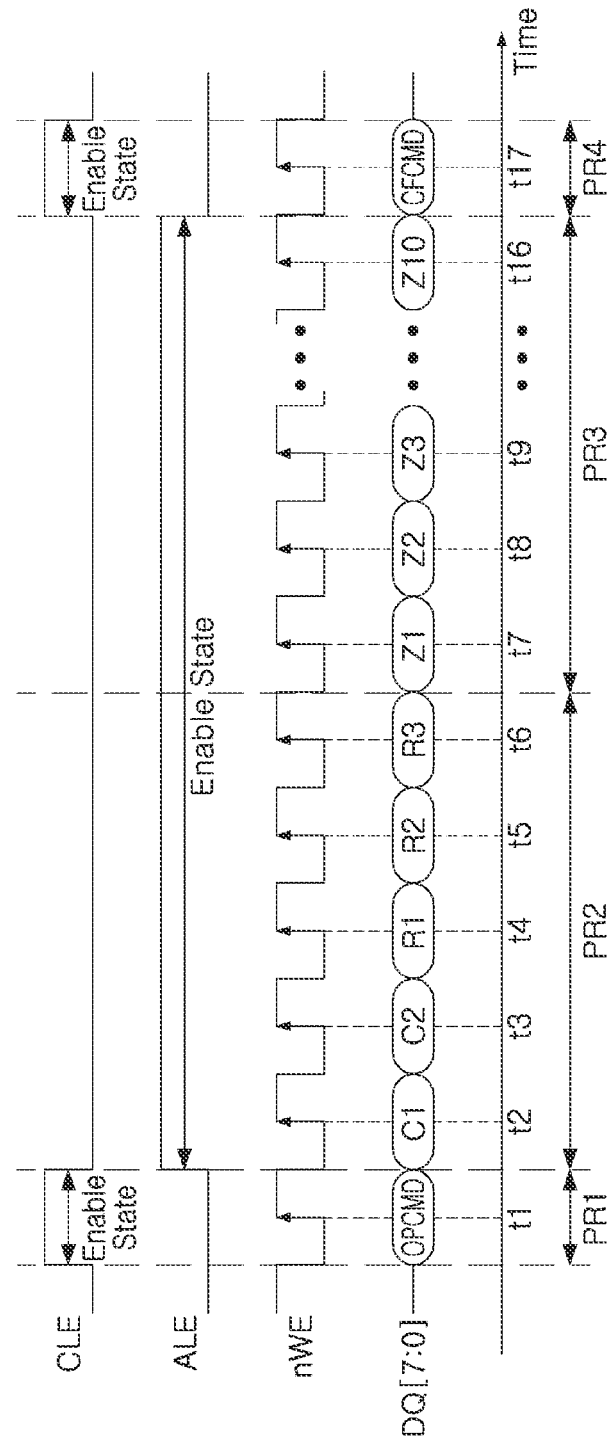
FIGS. 7A and 7B are timing diagrams illustrating a method of transmitting a command according to a comparative example and an example embodiment of the present disclosure.
Figure 7B:
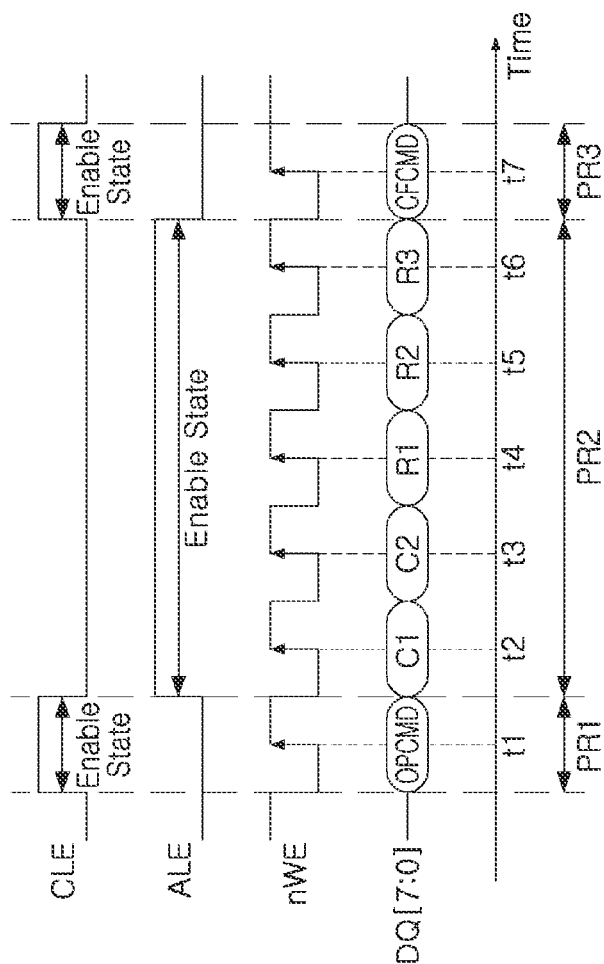

FIGS. 7A and 7B are timing diagrams illustrating a method of transmitting a command according to a comparative example and an example embodiment.

FIG. 7A illustrates a method of transmitting a command according to a comparative example different from the example embodiment. According to the comparative example, the memory controller 110 obtains a temperature value from the target nonvolatile memory 121, and determines an operation parameter based on the temperature value. Also, the memory controller 110 provide the operation parameter along with a command and an address to the target nonvolatile memory 121. The timing diagram in FIG. 7A illustrates the timing at which the memory controller 110 provides the command, the address, and the operation parameter to the target nonvolatile memory 121.

Referring to FIG. 7A, the memory controller 110 may transmit a data signal DQ [7:0]) including an operation command OPCMD to the target nonvolatile memory 121 in the first time period PR1 in which the CLE signal is enabled.

For example, the operation command OPCMD may be one of a program command, a read command, and an erase command.

The memory controller 110 may transmit the data signal DQ[7:0] including the actual address to the target nonvolatile memory 121 in the second time period PR2 in which the ALE signal is enabled. For example, the actual address may be transmitted over five clock cycles and may include column addresses C1 and C2 and row addresses R1-R3.

The memory controller 110 may transmit the data signal DQ[7:0] including operation parameters Z1-Z10 to the target nonvolatile memory 121 in the third time period PR3 in which the ALE signal is enabled. When the operation command CMD is a read command, the operation parameters Z1-Z10 may include an offset level of the read voltage.

The memory controller 110 may transmit the data signal DQ[7:0] including the confirm command CFCMD to the target nonvolatile memory 121 in the fourth time period PR4 in which the CLE signal is enabled. The confirm command CFCMD may be configured as a command for notifying the target nonvolatile memory 121 that an entirety of actual addresses and operation parameters related to the operation command OPCMD have been transmitted.

The target nonvolatile memory 121 may sample the data signal DQ[7:0] at rising edges of the nWE signal and may obtain the operation command OPCMD, the actual addresses C1, C2 and R1-R3, and the operation parameters Z1-Z10 and the confirm command CFCMD. The operation command OPCMD may include signal values of the data signal DQ[7:0] at the first time point t1. The actual addresses C1, C2, and R1-R3 may include signal values of the data signals DQ[7:0] at second to sixth time points t2-t6. The operation parameters Z1-Z10 may include signal values of the data signals DQ[7:0] at seventh to 16th time points t7 to t16. Also, the confirm command CFCMD may include signal values of the data signal DQ[7:0] at the 17th time point t17.

When the target nonvolatile memory 121 obtains the confirm command CFCMD, the target nonvolatile memory 121 may determine the operation parameters of the operation command OPCMD based on the previously received operation parameters Z1-Z10, and may perform an operation indicated by the operation command OPCMD with respect to the actual address C1, C2 and R1-R3.

According to the comparative example, the memory controller 110 may compensate the operation characteristics according to a temperature of the target nonvolatile memory 121 by transmitting the operating parameters Z1-Z10 according to the temperature of the target nonvolatile memory 121. When the memory controller 110 separately transmits the operation parameters Z1-Z10, it may take an additional time corresponding to 10 clock cycles to transmit the command to the target nonvolatile memory 121. When the memory controller 110 transmits a plurality of commands to a plurality of nonvolatile memories connected to a single channel in sequence, the time at which the command is transmitted may be further delayed.

FIG. 7B illustrates a command transmission method according to an example embodiment. In the example embodiment, the memory controller 110 does not obtain a temperature value from the target nonvolatile memory 121 each time, and determines the temperature value of the target nonvolatile memory 121 using an input/output workload of the target nonvolatile memory 121 and/or a temperature value of the external temperature sensor 130. Also, the memory controller 110 may determine an operation command corresponding to a temperature range to which the temperature value of the target nonvolatile memory 121 belongs, and may provide the operation command and the address to the target nonvolatile memory 121.

The timing diagram in FIG. 7B illustrates the timing at which the memory controller 110 provides an operation command and an address to the target nonvolatile memory 121. A method of determining the temperature value of the target nonvolatile memory 121 of the memory controller 110 will be described in greater detail with reference to FIGS. 10 to 12.

Referring to FIG. 7B, the memory controller 110 may transmit the data signal DQ[7:0] including the operation command OPCMD to the target nonvolatile memory 121 in the first time period PR1 in which the CLE signal is enabled. The operation command OPCMD may indicate one of a program operation, a read operation, and an erase operation in a temperature range to which the temperature value of the target nonvolatile memory 121 belongs. Even commands for instructing the same type of operation may have different signal values depending on the temperature ranges.

The memory controller 110 may transmit the data signal DQ[7:0] including the actual address to the target nonvolatile memory 121 in the second time period PR2 in which the ALE signal is enabled. For example, the actual address may be transmitted over five clock cycles and may include column addresses C1 and C2 and row addresses R1-R3.

The memory controller 110 may transmit the data signal DQ[7:0] including the confirm command CFCMD to the target nonvolatile memory 121 in the third time period PR3 in which the CLE signal is enabled.

The target nonvolatile memory 121 may sample the data signal DQ[7:0] at rising edges of the nWE signal and may obtain an operation command OPCMD, actual addresses C1, C2, and R1-R3 and a confirm command CFCMD. The operation command OPCMD may include signal values of the data signal DQ[7:0] at the first time point t1. The actual addresses C1, C2, and R1-R3 may include signal values of the data signals DQ[7:0] at second to sixth time points t2-t6. Also, the confirm command CFCMD may include signal values of the data signal DQ[7:0] at the seventh time point t7.

When the target nonvolatile memory 121 obtains the confirm command CFCMD, the target nonvolatile memory 121 may perform an operation of a type defined by the operation command OPCMD on the actual address C1, C2, and R1-R3 according to the operation parameter defined by the operation command OPCMD.

In an example embodiment, the memory controller 110 may transmit, to the target nonvolatile memory 121, an operation command for compensating operation characteristics according to temperature within a single clock cycle. Comparing the comparative example with the example embodiment, a time corresponding to 10 clock cycles may be reduced to transmit a single command. Accordingly, the time of processing a command may be reduced, and performance of the storage device 100 may be increased.

FIGS. 8A and 8B are diagrams illustrating operation commands according to an example embodiment.

FIG. 8A illustrates a first example of operation commands for each temperature range defined for each of a plurality of operation types. Referring to FIG. 8A, operation types may include a program operation, a read operation, and an erase operation. Also, the temperature range may include first to fifth temperature ranges R1-R5. Operation commands corresponding to the first to fifth temperature ranges R1 to R5 may be defined for the program operation, the read operation, and the erase operation.

Values or bit patterns such as '61h,' '81h,' and '01h,' illustrated for each operation type and the temperature range in FIG. 8A may represent commands which the memory controller 110 transmits to the target nonvolatile memory 121 to provide an operation command corresponding to the operation type and temperature range. For example, for the memory controller 110 to instruct a read operation when the current temperature of the target nonvolatile memory 121 is '−5° C.,' a value of '81h' corresponding to the first temperature range R1 including '−5° C.' is included in the enable section of the CLE signal sent to the target nonvolatile memory 121 as an operation command OPCMD. The value may also be used to determine whether the operation command OPCMD is for performing a read operation, a program operation or an erase operation.

When the target nonvolatile memory 121 receives a command from the memory controller 110, the target nonvolatile memory 121 may determine an operation parameter corresponding to the operation command indicated by the command and may perform an operation defined in the operation command. For example, the target nonvolatile memory 121 may perform a read operation by applying read voltages having different levels when receiving the command '81h' and when receiving the command '82h'. For example, the target nonvolatile memory 121 may perform a read operation by applying a first read voltage when receiving the '81h' read command and perform a read operation by applying a second other read voltage when receiving the '82h' read command.

Referring to FIG. 8A, a default command may be determined from among the operation commands defined for the operation types, respectively. The default command may refer to a command transmitted to the target nonvolatile memory 121 to instruct each type of operation when the memory controller 110 may not or does not determine the temperature value of the target nonvolatile memory 121. The default command may be defined in advance. FIG. 8A illustrates an example in which commands '60h,' '80h,'' and '00h' corresponding to the fourth temperature range R4 are determined as default commands. The default commands may be sent when it is assumed that a temperature of the memory device is in a certain temperature range. For example, in FIG. 8A, it is assumed that the temperature of the memory device is in the fourth temperature range R4.

In an example embodiment, the default command may be determined by a request from a host. For example, the host may provide an average external temperature value of the storage device 100 to the storage device 100 through an interface for communication with the storage device 100. The storage device 100 may determine commands in a temperature range including the average external temperature value as default commands. When the storage device 100 is mounted in a fixed position, such as a server, the temperature of the storage device 100 may be maintained in a constant range. When the default command is determined based on the external temperature value, the memory controller 110 may compensate the operation characteristic of the nonvolatile memory depending on the temperature even when the temperature value of the target nonvolatile memory 121 is not determined. Accordingly, reliability of the storage device 100 may be increased.

FIG. 8A illustrates an example in which the same number of operation commands are defined for each operation type in advance. However, example embodiments thereof are not limited thereto. FIG. 8B illustrates a second example of operation commands for each temperature range defined in each operation type.

FIG. 8B illustrates an example in which different numbers of operation commands are defined for a program operation, a read operation, and an erase operation. For example, a difference in operation characteristics of a nonvolatile memory depending on temperature may more greatly affect a read operation than a program operation. In the example in FIG. 8B, only two operation commands '61h' and '60h' are defined as the operation commands for the program operation, and five commands are defined as the operation commands for the read operation, such that the operation parameters for the read operation may be adjusted with precision.

The nonvolatile memories NVM11-NVM24 included in the storage device 100 may also have different temperatures. For example, a nonvolatile memory disposed externally of the storage device 100 may rapidly discharge heat as compared to the nonvolatile memory disposed in the storage device 100, such that the nonvolatile memory disposed externally of the storage device 100 may have a relatively low temperature.

In an example embodiment, the memory controller 110 may effectively compensate the operation characteristics of each nonvolatile memory by determining a temperature value for each of the nonvolatile memories NVM11-NVM24.

FIG. 9 is a diagram illustrating a temperature range for each nonvolatile memory according to an example embodiment.

The memory controller 110 may store temperature information for each of the nonvolatile memories NVM11-NVM24. FIG. 9 illustrates an example in which the memory controller 110 may manage the temperature range to which the temperature values of the nonvolatile memories NVM11-NVM24 belong in a table format. The memory controller 110 may obtains a temperature range of the target nonvolatile memory by referring to a table to provide an operation command to the target nonvolatile memory, and may provide an operation command corresponding to the temperature range to the target nonvolatile memory.

However, the temperature of the nonvolatile memories NVM11-NVM24 may change over time. For the memory controller 110 to obtain a temperature value from the internal temperature sensor NTS of each of the nonvolatile memories NVM11-NVM24, the memory controller 110 may need to communicate with the nonvolatile memories NVM11-NVM24 through the channels CH1 and CH2. Since the memory controller 110 may not input or output signals different from those of the nonvolatile memories NVM11-NVM24 while obtaining the temperature value, frequent obtaining of the temperature value by the memory controller 110 may degrade performance of the storage device 100.

Hereinafter, various methods in which the memory controller 110 determines the temperature values of the nonvolatile memories NVM11-NVM24 according to example embodiments will be described with reference to FIGS. 10 to 12.

Figure 10:
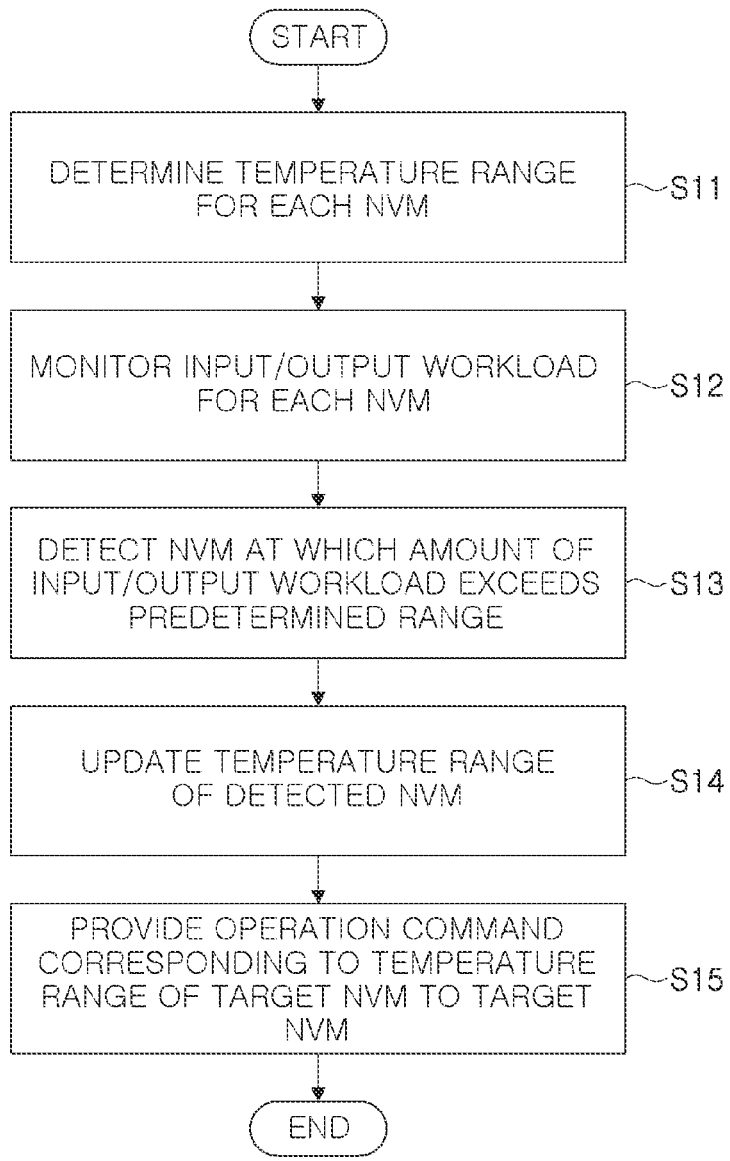
FIGS. 10 to 12 are flowcharts illustrating an operation of a storage device according to an example embodiment of the present disclosure.
Figure 11:
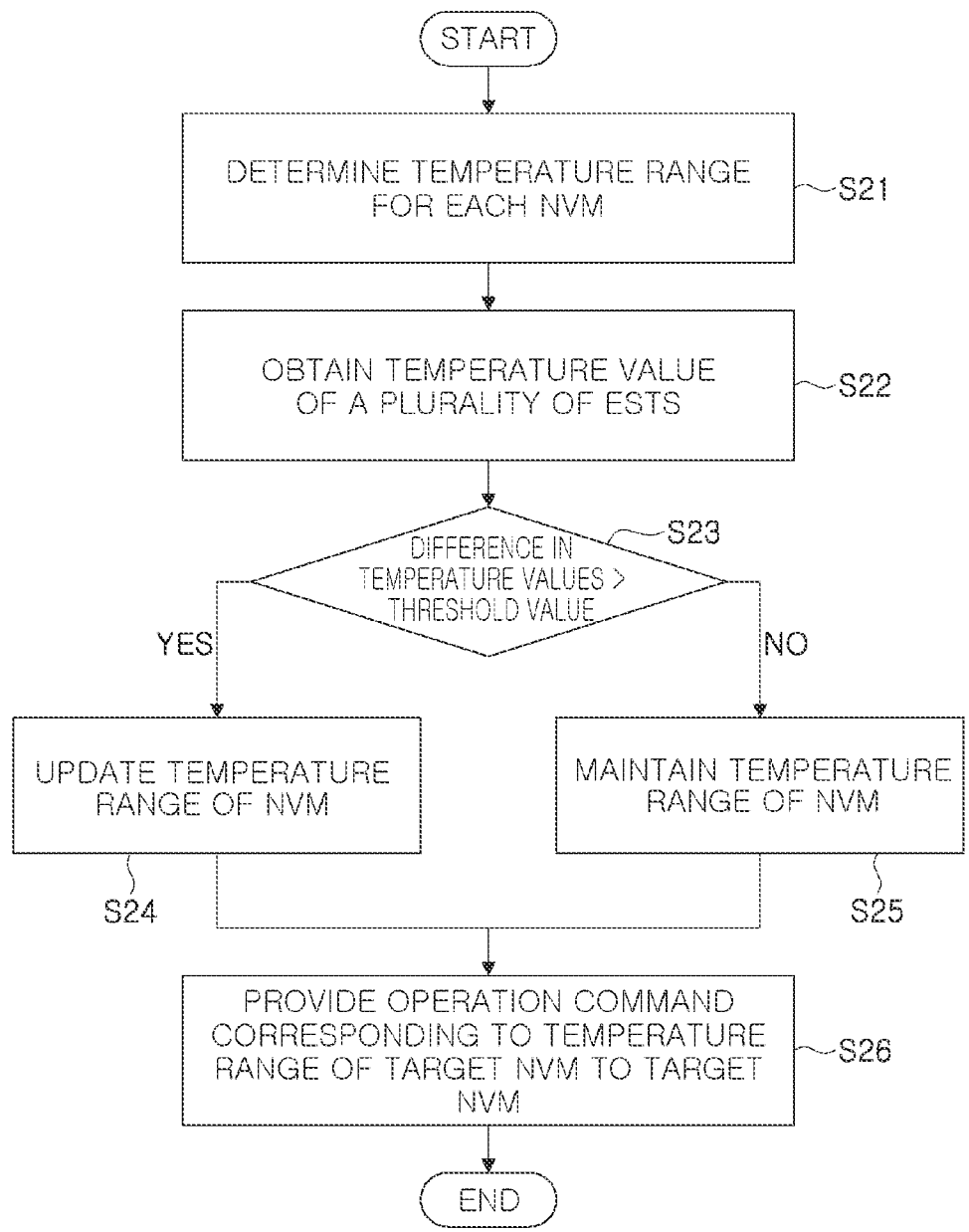
Figure 12:
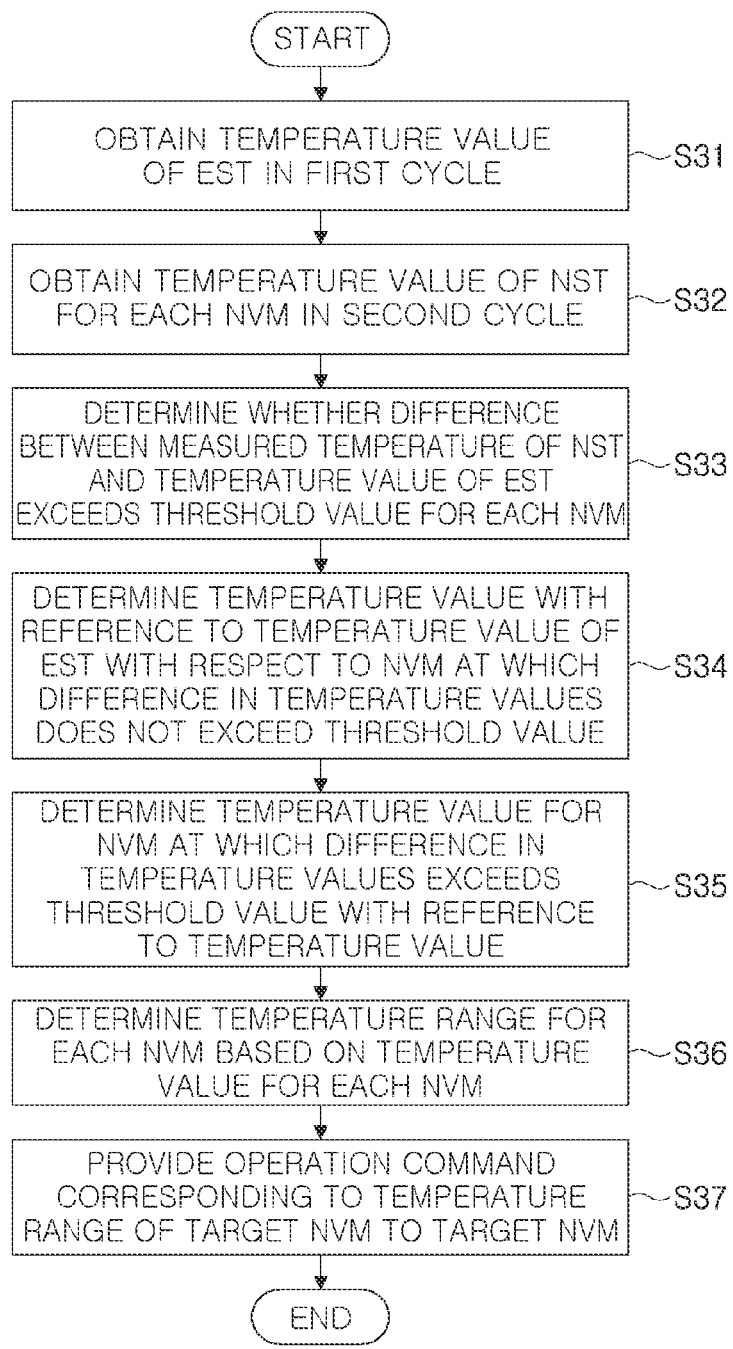

FIGS. 10 to 12 are flowcharts illustrating an operation of a storage device according to an example embodiment.

FIG. 10 illustrates an operation of a storage device according to an example embodiment.

In operation S11, the memory controller determines a temperature range for each nonvolatile memory NVM. For example, the memory controller may obtain a temperature value from an internal temperature sensor of the nonvolatile memories NVM, and may determine a temperature range to which the temperature value belongs as a temperature range for each nonvolatile memory NVM.

In operation S12, the memory controller monitors the input/output workload for each nonvolatile memory NVM.

As a first example of monitoring the input/output workload, the memory controller may monitor a degree of wearout of each nonvolatile memory NVM in a predetermined time period. The degree of wearout may be determined from at least one of a P/E (program/erase) cycle of memory blocks included in the nonvolatile memory, an erase count of the memory blocks, and the number of pages programmed in the nonvolatile memory. The P/E cycle may indicate an average value of the number of times memory blocks included in the nonvolatile memory NVM are programmed and erased.

As a second example of monitoring the input/output workload, the memory controller may monitor the amount of data read from each nonvolatile memory NVM in a predetermined time period. The input/output workload may be determined from the amount.

In operation S13, the memory controller detects a nonvolatile memory NVM in which the amount of input/output workload is beyond or outside a predetermined range. It may be predicted that a great deal of heat is generated in the nonvolatile memory NVM in which the amount of I/O workload is greater than a predetermined range, and the temperature of the nonvolatile memory NVM in which the amount of I/O workload is less than the predetermined range may be predicted to decrease. The temperature of the nonvolatile memory NVM in which the amount of input/output workload falls within a predetermined range may be predicted to be maintained at a level similar to the previous level. Accordingly, the memory controller may, by maintaining the current temperature range of the nonvolatile memory NVM of which the amount of the input/output workload is within the predetermined range without updating the temperature range, reduce the time for transmitting/receiving a signal to obtain a temperature value from the internal temperature sensor of the nonvolatile memory NVM.

In operation S14, the memory controller may update the detected current temperature range of the nonvolatile memory NVM. For example, the memory controller may obtain a temperature value from an internal temperature sensor of the detected nonvolatile memory NVM, and may determine a temperature range to which the temperature value belongs as the detected temperature range of the nonvolatile memory NVM.

In operation S15, the memory controller may provide an operation command corresponding to a temperature range of the target nonvolatile memory NVM to the target nonvolatile memory NVM.

According to the example embodiment, the time required for the memory controller to obtain the temperature from the internal temperature sensor through the channel to update the temperature range may be reduced. Accordingly, the memory controller may compensate for the temperature-dependent operation characteristics of the nonvolatile memory NVM while reducing the transmission/reception time of the channel for determining the temperature range.

FIG. 11 illustrates an operation of a storage device according to an example embodiment.

In operation S21, the memory controller determines a temperature range for each nonvolatile memory NVM. For example, the memory controller may determine a temperature range for each nonvolatile memory NVM based on a temperature value from an internal temperature sensor of the nonvolatile memories NVM.

In operation S22, the memory controller obtains a temperature value (e.g., an external temperature value) from the plurality of external temperature sensors EST or only one of the external temperature sensor EST. In an example embodiment, the memory controller obtains a temperature value from a plurality of external temperature sensors EST disposed in different positions in the storage device. The memory controller may obtain a temperature value from the external temperature sensors EST through an interface other than channels connected to the nonvolatile memories NVM.

In operation S23, the memory controller determines whether a difference in temperature values between the external temperature sensors ETS exceeds a threshold value. When the difference between the temperature values of the external temperature sensors ETS disposed in different positions exceeds a threshold value, it may be predicted that a sudden temperature change has occurred in the storage device. When the difference between the temperature values does not exceed the threshold, it may be predicted that the temperature of the storage device is maintained to be relatively constant.

When the difference between the temperature values exceeds the threshold (in operation S23, "Yes"), the memory controller may update the temperature range for each nonvolatile memory NVM. For example, the memory controller may determine a temperature range for each nonvolatile memory NVM based on a temperature value from an internal temperature sensor of the nonvolatile memories NVM.

When the difference between the temperature values does not exceed the threshold (in operation S23, "No"), the memory controller does not update the temperature range for each nonvolatile memory NVM, and may use the previously determined temperature range.

In operation S26, the memory controller may provide an operation command corresponding to a temperature range of the target nonvolatile memory NVM to the target nonvolatile memory NVM.

According to the example embodiment, when it is predicted that there is no sudden change in the temperature of the storage device, the updating of the temperature range of the nonvolatile memory NVM may be omitted. Accordingly, the memory controller may compensate the operation characteristics according to the temperature of the nonvolatile memory NVM while reducing the time required for transmission/reception of the channel for determining the temperature range of the nonvolatile memory NVM.

FIG. 12 illustrates an operation of a storage device according to an example embodiment.

In operation S31, the memory controller obtains the temperature value of the external temperature sensor ETS in a first cycle.

In operation S32, the memory controller obtains the temperature value of the internal temperature sensor NTS for each nonvolatile memory NVM in a second cycle. For example, the second cycle may occur sequentially after the first cycle.

A ratio between the first cycle and the second cycle may be dynamically determined. For example, in the command queue for queuing commands to be executed in the nonvolatile memory NVM, the memory controller may increase the ratio of the first cycle to the second cycle as the number of queued commands decreases, such that temperature values may be obtained frequently. The command queue may be located in the memory controller 110 or the memory device 100. The memory controller may obtain a temperature value from an internal temperature sensor NTS for each nonvolatile memory NVM while reducing an effect on the command processing speed.

In an example embodiment, the second cycle is a rarer or a less frequent cycle than the first cycle. That is, the memory controller may check the internal temperature sensor NTS relatively occasionally, and may check the external temperature sensor ETS relatively frequently. In an embodiment when the memory controller checks the external temperature sensor ETS, the memory controller does not occupy the channels connecting the memory controller to the nonvolatile memory NVM, and accordingly, frequent checking of the external temperature sensor ETS by the memory controller may not affect the command processing speed.

In operation S33, the memory controller determines whether a difference between the temperature value of the internal temperature sensor NTS and the temperature value of the external temperature sensor ETS for each nonvolatile memory NVM exceeds a threshold value.

In operation S34, the memory controller determines the temperature value of the external temperature sensor ETS as the temperature value of the nonvolatile memory NVM for the nonvolatile memory NVM in which the difference in temperature value does not exceed the threshold value. When the temperature value of the external temperature sensor ETS is determined as the current temperature value of the nonvolatile memory NVM, the temperature value of the nonvolatile memory NVM may be updated without accessing the internal temperature sensor NTS through a channel.

In operation S35, the memory controller determines the temperature value of the nonvolatile memory NVM using the temperature value of the internal temperature sensor NTS for the nonvolatile memory NVM in which the difference in temperature value exceeds the threshold value.

As a first example, the memory controller determines the temperature value of the internal temperature sensor NTS of the nonvolatile memory NVM as the temperature value of the nonvolatile memory NVM as is. However, example embodiments thereof are not limited thereto. Since the temperature difference between the internal temperature sensor NTS and the external temperature sensor ETS may deviate from the threshold value due to a measurement error of the internal temperature sensor NTS, the memory controller may determine the temperature value as in second and third examples as below.

As a second example, the memory controller determines the temperature value of the nonvolatile memory NVM in which the difference between the temperature values exceeds a threshold value as an average temperature value of the plurality of nonvolatile memories NVM.

As a third example, the memory controller re-obtains the temperature value of the internal temperature sensor NTS of the nonvolatile memory NVM in which the difference in temperature exceeds a threshold value, and determines the temperature value of the volatile memory NVM based on the re-obtained temperature value.

In operation S36, the memory controller determines a temperature range for each nonvolatile memory NVM based on the temperature value for each nonvolatile memory NVM.

In operation S37, the memory controller provides an operation command corresponding to a temperature range of the target nonvolatile memory NVM to the target nonvolatile memory NVM.

According to the example embodiment of FIG. 12, when it is determined that the internal temperature value of the nonvolatile memory NVM is similar to the temperature value of the external temperature sensor ETS, the temperature range of the nonvolatile memory NVM may be determined using the temperature value of the external temperature sensor ETS. Accordingly, the memory controller may compensate the operation characteristics according to the temperature of the nonvolatile memory NVM while reducing the time for inputting/outputting the channel for determining the temperature range of the nonvolatile memory NVM.

Figure 13:
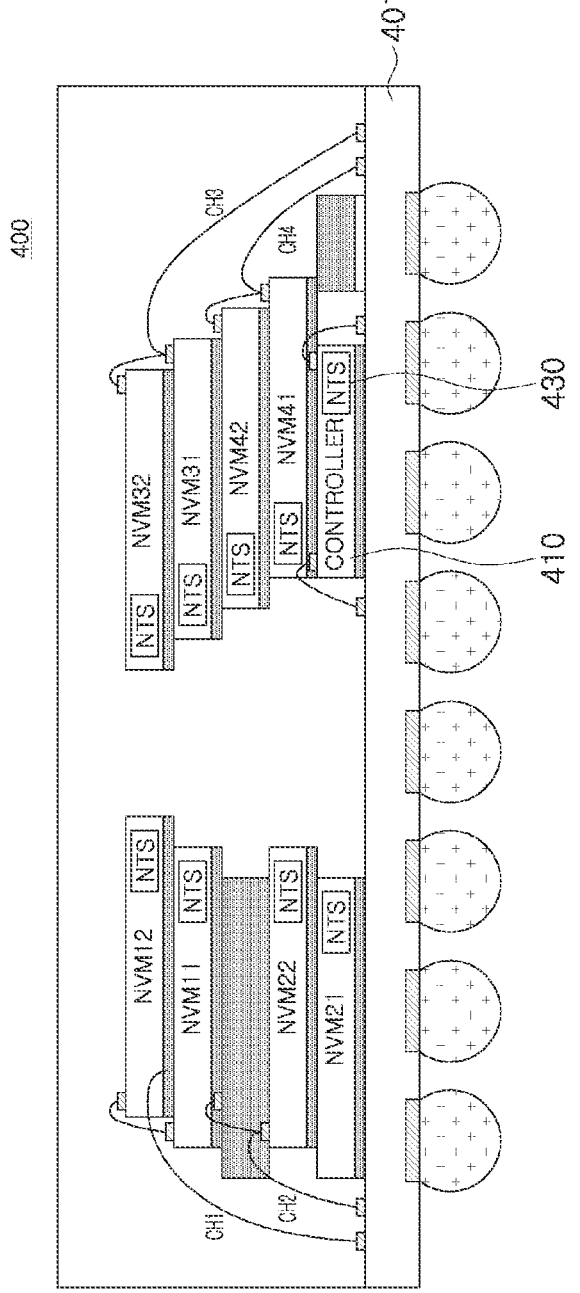
FIGS. 13 and 14 are diagrams illustrating a structure of a storage device according to an example embodiment of the present disclosure.
Figure 14:
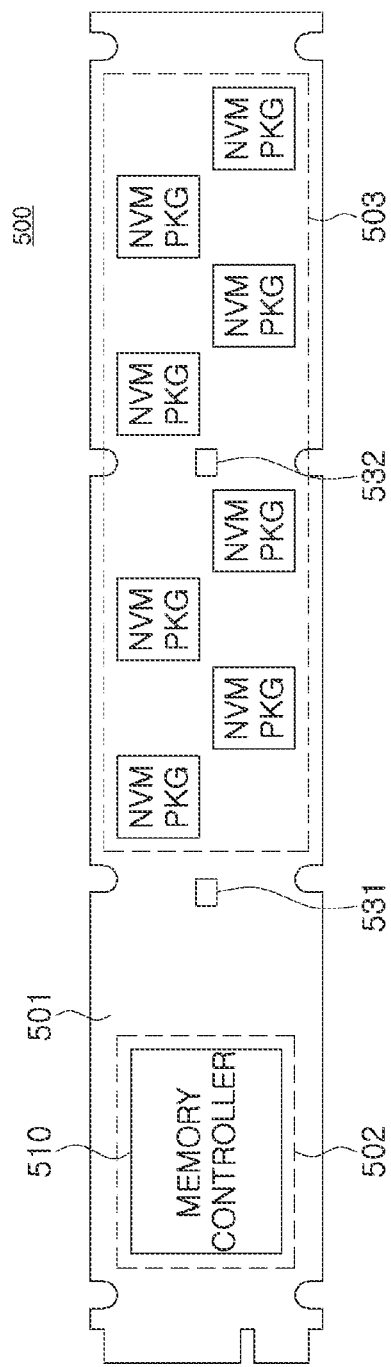

FIGS. 13 and 14 are diagrams illustrating a structure of a storage device according to an example embodiment.

Referring to FIG. 13, a storage device 400 may include a memory controller 410, nonvolatile memories NVM11-NVM42, and channels CH1-CH4. The memory controller 410 and the nonvolatile memories NVM11-NVM42 may be stacked on the substrate 401 and may be included in a package.

In the example in FIG. 13, the memory controller 410 may transmit signals to and may receive signals from the nonvolatile memories NVM11-NVM12 through the first channel CH1, may transmit signals to and may receive signals from the nonvolatile memories NVM21-NVM22 through the second channel CH2, may transmit signals to and may receive signals from the nonvolatile memories NVM31-NVM32 through a third channel CH3, and may transmit signals to and may receive signals from the nonvolatile memories NVM41-NVM42 through a fourth channel CH4. In the example in FIG. 13, the storage device 400 may include nonvolatile memories NVM11-NVM42 connected to four channels CH1-CH4, but the number of nonvolatile memories and the number of channels are not limited to the illustrated example.

Each of the nonvolatile memories NVM11-NVM42 may include an internal temperature sensor NTS. Also, the memory controller 410 may include an external temperature sensor ETS. The memory controller 410 may have to use the channels CH1-CH4 to obtain a temperature value from the internal temperature sensor NTS of the nonvolatile memories NVM11-NVM42. The memory controller 410 may access the external temperature sensor ETS through an interface separate from the channels CH1-CH4. Accordingly, the obtaining of a temperature value through the external temperature sensor ETS by the memory controller 410 may not affect data transmission performance of the memory controller 410 and the nonvolatile memories NVM11-NVM42.

In an example embodiment, the memory controller 410 may compensate for the operation characteristics depending on the temperature of the nonvolatile memories NVM11-NVM42 by providing an operation command corresponding to a temperature range to which a temperature value of the nonvolatile memories NVM11-NVM42 belongs.

The memory controller 410 may obtain the temperature value of the external temperature sensor ETS in a first cycle, and may obtain the temperature value of the internal temperature sensor NTS of the nonvolatile memories NVM11-NVM42 through the channels CH1-CH4 in a second cycle rarer or less frequent than the first cycle.

The memory controller 410 may determine a temperature value of the external temperature sensor ETS as a temperature value of the nonvolatile memory with respect to the nonvolatile memory in which the temperature difference between the external temperature sensor ETS and the internal temperature sensor NTS is less than or equal to a first threshold value. In the example in FIG. 13, the nonvolatile memory NVM41 adjacent to the memory controller 410 may be greatly affected by the temperature change of the memory controller 410, and a difference between the temperature value of the internal temperature sensor NTS and the temperature value of the and the external temperature sensor ETS may be equal to or less than the first threshold value. The memory controller 410 may determine the temperature value of the nonvolatile memory NVM41 using the temperature value of the external temperature sensor ETS, which may minimally affect data transmission performance even when being frequently accessed.

The memory controller 410 may determine the temperature value of the internal temperature sensor NTS as the temperature value of the nonvolatile memory with respect to the nonvolatile memory in which the temperature difference exceeds the first threshold value. For example, the nonvolatile memory NVM12 disposed distantly from the memory controller 410 may be less affected by the temperature change of the memory controller 410, and the difference between the temperature value of the internal temperature sensor NTS and the temperature value of the external temperature sensor ETS may be equal to or greater than the first threshold value. The memory controller 410 may determine the temperature value of the nonvolatile memory NVM12 using the temperature value of the internal temperature sensor NTS of the nonvolatile memory NVM12.

Referring to FIG. 14, the storage device 500 may include a substrate 501 in which a controller region 502 and a nonvolatile memory region 503 are disposed. A memory controller 510 may be disposed in the controller region 502 of the substrate 501, and a plurality of nonvolatile memory packages NVMPKG may be disposed in the nonvolatile memory region 503. The nonvolatile memory packages NVMPKG may include a plurality of stacked nonvolatile memories (not illustrated), and each of the nonvolatile memories may include an internal temperature sensor. The memory controller 510 and the nonvolatile memories may transmit/receive signals through channels (not illustrated). The memory controller 510 may obtain temperature values of nonvolatile memories from an internal temperature sensor through channels.

The storage device 500 may further include one or more external temperature sensors. For example, a first external temperature sensor 531 may be disposed externally of the nonvolatile memory region 503 of the substrate 501, and a second external temperature sensor 532 may be disposed within the nonvolatile memory region 503. The memory controller 510 may obtain temperature values from the first and second external temperature sensors 531 and 532 through an interface other than channels for transmitting signals to and receiving signals from the nonvolatile memories.

In an example embodiment, the memory controller 510 may obtain temperature values from an internal temperature sensor of the nonvolatile memories, and may determine each of the obtained temperature values as temperature values of the nonvolatile memories, respectively. The memory controller 510 may provide, to the target nonvolatile memory, an operation command determined based on a current temperature value of a target nonvolatile memory among nonvolatile memories.

When the difference between the temperature value of the first external temperature sensor 531 and the temperature value of the second external temperature sensor 532 is equal to or greater than a threshold value, the memory controller 510 may obtain a temperature value from the internal temperature sensors of the plurality of nonvolatile memories and may update the current temperature value with the obtained temperature value. When the difference between the temperature values is smaller than the threshold value, the memory controller 510 may maintain the temperature values of the nonvolatile memories without updating the value.

When the internal or external temperature of the nonvolatile memory region 503 rapidly changes, a temperature difference equal to or greater than a threshold value of the first and second external temperature sensors 531 and 532 may be detected. The memory controller 510 may determine that the internal temperature of the nonvolatile memories does not change significantly until a temperature difference equal to or greater than the threshold value is detected, and may provide an operation command to the nonvolatile memories using the previously determined temperature value as is. In an example embodiment, since the input/output workload of channels required to determine the temperature value of the nonvolatile memories may be reduced, performance of the storage device 500 may increase.

Figure 15:
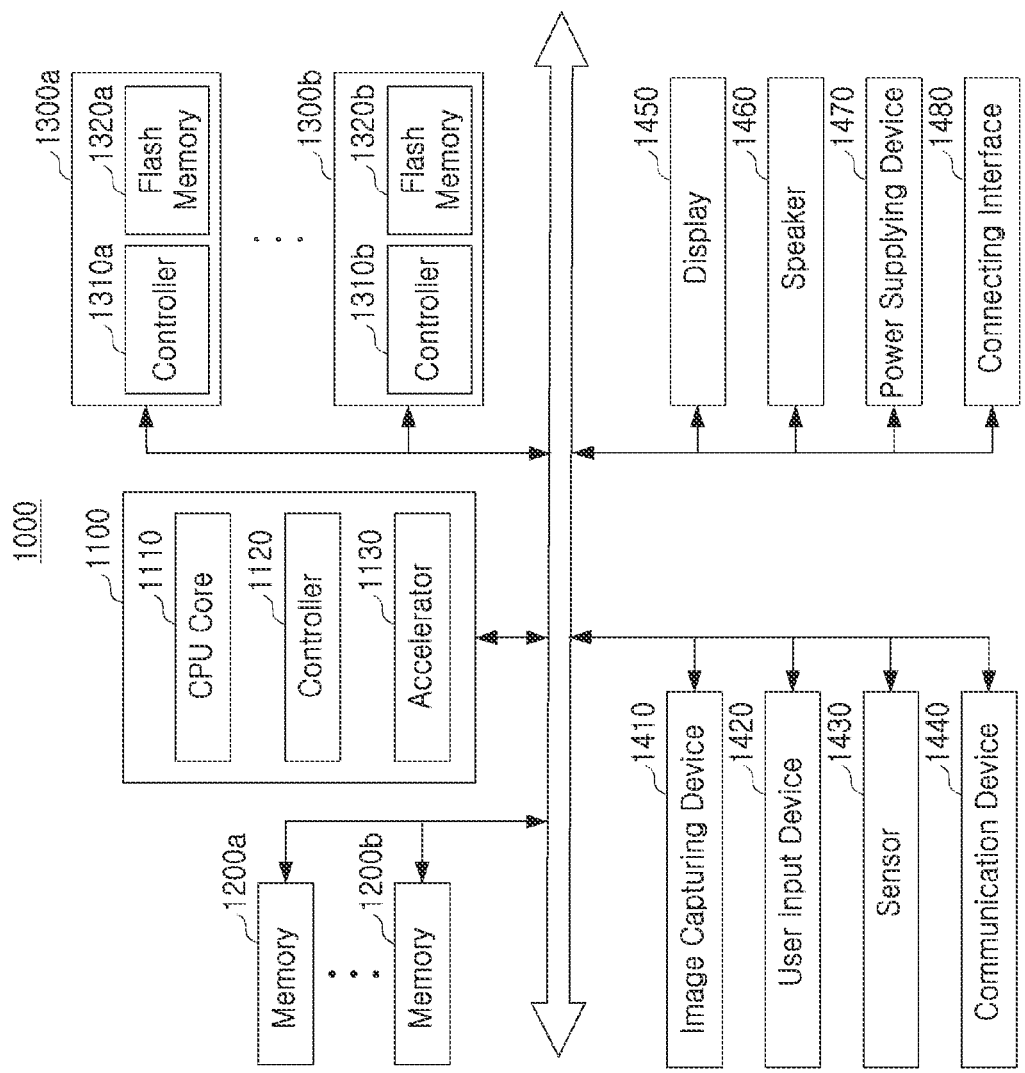
FIG. 15 is a diagram illustrating a system to which a storage device according to an example embodiment of the present disclosure.

FIG. 15 is a diagram illustrating a system to which a storage device according to an example embodiment.

FIG. 15 is a diagram illustrating a system 1000 to which a storage device in an example embodiment is applied. The system 1000 in FIG. 15 may be implemented as a mobile system, such as a mobile phone, a smart phone, a tablet personal computer (PC), a wearable device, a healthcare device, or an Internet of things (IOT) device. However, the system 1000 in FIG. 15 is not necessarily limited to a mobile system, and may be implemented as an automotive device such as a personal computer, a laptop computer, a server, a media player, or a navigation system.

Referring to FIG. 15, the system 1000 may include a main processor 1100, memories 1200a and 1200b, and storage devices 1300a and 1300b, may further include one or more of an image capturing device 1410, a user input device 1420, a sensor 1430, a communication device 1440, a display 1450, a speaker 1460, a power supplying device 1470 and a connecting interface 1480.

The main processor 1100 may control overall operations of the system 1000, more specifically, operations of the other components included in the system 1000. The main processor 1100 may be implemented as a general-purpose processor, a dedicated processor, or an application processor.

The main processor 1100 may include one or more central processing unit (CPU) cores 1110, and may further include a controller 1120 (e.g., a control circuit) for controlling the memories 1200a and 1200b and/or the storage devices 1300a and 1300b. In example embodiments, the main processor 1100 may further include an accelerator 1130 which may be a dedicated circuit for high-speed data operation such as an artificial intelligence (AI) data operation. The accelerator 1130 may include a graphics processing unit (GPU), a neural processing unit (NPU), and/or a data processing unit (DPU), and may be implemented as a chip physically independent from other components of the main processor 1100.

The memories 1200a and 1200b may be used as the main memory devices of the system 1000 and may include volatile memory such as a static random-access-memory (SRAM) and/or a dynamic random-access-memory (DRAM), or may include a nonvolatile memory such as flash memory, phase-change random-access-memory (PRAM) and/or resistive random-access-memory (RRAM). The memories 1200a and 1200b may be implemented in the same package as the main processor 1100.

The storage devices 1300a and 1300b may function as nonvolatile storage devices storing data regardless of whether power is supplied or not, and may have a relatively large storage capacity as compared to that of the memories 1200a and 1200b. The storage devices 1300a and 1300b may include storage controllers 1310a and 1310b and nonvolatile memory NVM 1320a and 1320b for storing data under control of the storage controllers 1310a and 1310b. The nonvolatile memories 1320a and 1320b may include a flash memory having a 2-dimensional (2D) structure or a 3-dimensional (3D) vertical NAND (V-NAND) structure, or may include other types of nonvolatile memory such as PRAM and/or RRAM.

The storage devices 1300a and 1300b may be included in the system 1000 in a state physically separated from the main processor 1100, or may be implemented in the same package as the main processor 1100. Also, the storage devices 1300a and 1300b may have the same shape as that of a solid state device (SSD) or a memory card, and may be coupled to be able to attached to and detached from the other components of the system 1000 through an interface such as a connection interface 1480. The storage devices 1300a and 1300b may be configured as devices to which standard protocols such as universal flash storage (UFS), embedded multi-media card (eMMC), or nonvolatile memory express (NVMe) are applied, but example embodiments thereof are not limited thereto.

The photographing device 1410 (or image capturing device) may obtain a still image or a video, and may be implemented as a camera, a camcorder, and/or a webcam.

The user input device 1420 may receive various types of data input from the user of the system 1000, and may include a touch pad, a keypad, a keyboard, and a mouse, and/or a microphone.

The sensor 1430 may sense various types of physical quantities which may be obtained from an external entity of the system 1000, and may convert the sensed physical quantities into electrical signals. The sensor 1430 may be implemented as a temperature sensor, a pressure sensor, an illuminance sensor, a position sensor, an acceleration sensor, a biosensor and/or a gyroscope sensor.

The communication device 1440 may transmit signals to and may receive signals from the other devices present externally of the system 1000 according to various communication protocols. The communication device 1440 may include an antenna, a transceiver, and/or a modem (MODEM).

The display 1450 and the speaker 1460 may function as output devices for outputting visual information and auditory information to the user of the system 1000, respectively.

The power supply device 1470 may appropriately convert power supplied from a battery (not illustrated) embedded in the system 1000 and/or an external power source and may supply the power to each component of the system 1000.

The connection interface 1480 may provide a connection between the system 1000 and an external device connected to the system 1000 to exchange data with the system 1000. The connection interface 1480 may implement various interface methods such as, for example, advanced technology attachment (ATA), serial ATA (SATA), external SATA (e-SATA), small computer small interface (SCSI), serial attached SCSI (SAS), peripheral component interconnection (PCI), PCI express (PCIe), NVMe (NVM express), IEEE 1394, universal serial bus (USB), secure digital (SD) card, multi-media card (MMC), embedded multi-media card (eMMC), universal Flash Storage (UFS), embedded universal Flash Storage (eUFS), compact flash (CF) card interface, and the like.

In an example embodiment, the storage controllers 1310a and 1310b may provide a data signal including an operation command corresponding to a temperature range to which the temperature value of the nonvolatile memories 1320a and 1320b belongs to the nonvolatile memories 1320a and 1320b during a time period in which a CLE signal is enabled. The nonvolatile memories 1320a and 1320b may perform an operation of a type defined in the operation command using an operation parameter defined in the operation command. When the storage controllers 1310a and 1310b do not transmit a separate operation parameter according to the temperature value, operation characteristics according to the temperature condition of the nonvolatile memories 1320a and 1320b may be compensated without increasing the command transmission time.

In an example embodiment, the storage controllers 1310a and 1310b obtain the temperature values from the temperature sensor of the nonvolatile memories 1320a and 1320b through the channels connected to the nonvolatile memories 1320a and 1320b to determine the temperature values of the nonvolatile memories 1320a and 1320b. The storage controllers 1310a and 1310b may omit updating the temperature values of the nonvolatile memories 1320a and 1320b according to the amount of input/output workload of the nonvolatile memories 1320a and 1320b. Also, the storage controllers 1310a and 1310b may update the temperature values of the nonvolatile memories 1320a and 1320b based on a temperature value from an external temperature sensor connected through an interface separate from the channels depending on specific conditions. The storage controllers 1310a and 1310b may reduce the amount of input/output workload of the channel by reducing the frequency of obtaining a temperature value from the internal temperature sensor to determine the current temperature value. Accordingly, degradation of performance of the storage devices 1300a and 1300b due to the determination of the current temperature value may be reduced.

In an example embodiment, the main processor 1100 provides external temperature information of the storage devices 1300a and 1300b to the storage controllers 1310a and 1310b. For example, the external temperature information may include average temperature information of a server on which the storage devices 1300a and 1300b are mounted. The storage controllers 1310a and 1310b may determine a default command from among operation commands for each temperature range provided for a plurality of operation types using the external temperature information. Even when the storage controllers 1310a and 1310b do not determine the temperature values of the nonvolatile memories 1320a and 1320b using the internal temperature sensor, the storage controllers 1310a and 1310b may compensate the operation characteristic depending on the temperature of the nonvolatile memories 1320a and 1320b using the default command.

According to the aforementioned example embodiments, a storage device may, by defining an operation command for each temperature range of the nonvolatile memory, compensate operation characteristics varying depending on the temperature of the nonvolatile memory.

The storage device may, by allowing the memory controller to provide an operation command determined according to an operation period to which the temperature value of the nonvolatile memory belongs to the nonvolatile memory, reduce the time required to transmit a separate operation parameter.

The storage device may reduce an input/output burden of a memory controller communicating with a temperature sensor in the nonvolatile memory to determine a temperature value of the nonvolatile memory, such that degradation of performance of the storage device may be reduced.

While example embodiments have been illustrated and described above, it will be apparent to those skilled in the art that modifications and variations could be made without departing from the scope of the present disclosure as defined by the appended claims.

What is claimed is:

1. A storage device, comprising:
a plurality of nonvolatile memories each including an internal temperature sensor;
a memory controller configured to communicate with the plurality of nonvolatile memories through a first interface and having a plurality of operation commands defined for temperature ranges of the nonvolatile memories, respectively; and
an external temperature sensor configured to communicate with the memory controller via a second interface,
wherein the memory controller is configured to obtain an external temperature value from the external temperature sensor periodically at a first frequency and obtain an internal temperature value based on at least the internal temperature sensor of a target nonvolatile memory of the plurality of nonvolatile memories periodically at a second frequency different from the first frequency,
wherein the memory controller is configured to determine a temperature range of the target nonvolatile memory based on the external temperature value when a difference between the external temperature value and the internal temperature value is equal to or less than a first threshold value,
wherein the memory controller is configured to determine the temperature range based on the internal temperature value when the difference exceeds the first threshold value, and
wherein the memory controller is configured to provide an operation command corresponding to the temperature range from among the plurality of operation commands to the target nonvolatile memory.

2. The storage device of claim 1, wherein the memory controller is configured to select the operation command corresponding to the temperature range of the target nonvolatile memory and an operation type to be instructed from among the operation commands for temperature ranges defined in operation types including a program operation, a read operation, and an erase operation, respectively.

3. The storage device of claim 1, wherein the memory controller is configured to determine the internal temperature value based on an average temperature value determined from the internal temperature sensor of each of the plurality of nonvolatile memories.

4. The storage device of claim 1, wherein the internal temperature value is obtained again through the first interface, and the temperature range of the target nonvolatile memory is determined based on the obtained temperature value.

5. The storage device of claim 2, wherein the memory controller is configured to receive a temperature value of an external area of the storage device from a host and to determine a command corresponding to a temperature range to which the received temperature value belongs as a default command in each of the operation types.

6. The storage device of claim 1, wherein the storage device further includes a nonvolatile memory region in which the plurality of nonvolatile memories are disposed, and wherein the external temperature sensor include a first external temperature sensor disposed in the nonvolatile memory region and a second external temperature sensor disposed outside the nonvolatile memory region.

7. The storage device of claim 6, wherein, when a difference between a temperature value of the first external temperature sensor and a temperature value of the second external temperature sensor is equal to or greater than a second threshold value, the memory controller is configured to update the temperature range of the target nonvolatile memory of the plurality of nonvolatile memories based on the internal temperature value.

8. The storage device of claim 1, wherein the storage device further includes a substrate on which the memory controller and the plurality of nonvolatile memories are stacked.

9. The storage device of claim 1, wherein the memory controller further includes a command queue for queuing the operation commands to be provided to the plurality of nonvolatile memories, and a ratio between a first cycle when the external temperature value is obtained and a second cycle when the internal temperature value is obtained is determined according to a number of the operation commands queued in the command queue.

10. The storage device of claim 9, wherein the memory controller is configured to increase a ratio of the second cycle to the first cycle when the number of the operation commands queued in the command queue, is equal to or less than a threshold value.

11. The storage device of claim 1, wherein the second interface is an inter-integrated circuit (I2C) interface.

12. The storage device of claim 1, wherein the second frequency is less than the first frequency.

13. A storage device, comprising:
a plurality of nonvolatile memories each including an internal temperature sensor; and
a memory controller configured to control the plurality of nonvolatile memories and having a plurality of operation commands defined for different temperature ranges of the nonvolatile memories, respectively,
wherein the memory controller is configured to determine a temperature range of a target nonvolatile memory of the nonvolatile memories based on an internal temperature value of the internal temperature sensor of at least one of the nonvolatile memories,
wherein the memory controller is configured to periodically monitor input/output workload of the target nonvolatile memory,
wherein the memory controller is configured to update the temperature range of the target nonvolatile memory with reference to the internal temperature sensor of the target nonvolatile memory when the amount of the input/output workload is greater than or less than a predetermined range in a predetermined time period, and
wherein the memory controller is configured to provide an operation command from among the operation commands corresponding to the updated temperature range of the target nonvolatile memory to the target nonvolatile memory.

14. The storage device of claim 13, wherein the memory controller is configured to maintain the temperature range of the target nonvolatile memory when the amount of the input/output workload is within the predetermined range.

15. The storage device of claim 13, wherein the input/output workload is determined based on an amount of an increase of a degree of wearout of the target nonvolatile memory in the predetermined time period.

16. The storage device of claim 15, wherein the degree of wearout is at least one of a program/erase (P/E) cycle of memory blocks included in the target nonvolatile memory, an erase count of the memory blocks, and a number of programmed pages of the target nonvolatile memory.

17. The storage device of claim 13, wherein the input/output workload is determined based on an amount of data read from each of the target nonvolatile memory in the predetermined time period.

18. The storage device of claim 13, wherein the storage device further comprises:
   a nonvolatile memory region in which the plurality of nonvolatile memories are disposed;
   a first external temperature sensor disposed in the nonvolatile memory region; and
   a second external temperature sensor disposed outside the nonvolatile memory region.

19. The storage device of claim 18, wherein, when a difference between a first temperature value of the first external temperature sensor and a second temperature value of the second external temperature sensor is equal to or greater than a threshold value, the memory controller is configured to update the temperature range of the target nonvolatile memory of the plurality of nonvolatile memories based on the internal temperature value of the internal temperature sensor of at least one of the nonvolatile memories.

20. A storage device, comprising:
   a plurality of nonvolatile memories;
   a memory controller configured to control the plurality of nonvolatile memories and having a plurality of operation commands defined for different temperature ranges of the nonvolatile memories, respectively; and
   a channel configured to provide a command latch enable (CLE) signal and an address latch enable (ALE) signal output by the memory controller to a target nonvolatile memory of the plurality of nonvolatile memories,
   wherein the memory controller is configured to provide, to the target nonvolatile memory, an operation command defined as different values according to a temperature range to which a temperature value of the target nonvolatile memory belongs among the plurality of operation commands in a first time period in which the CLE signal is enabled, to provide an address to the target nonvolatile memory in a second time period in which the ALE signal is enabled, and to provide a confirm command to the target nonvolatile memory in a third time period in which the CLE signal is enabled, and
   wherein the target nonvolatile memory determines an operation parameter corresponding to the operation command and performs an operation defined in the operation command.

* * * * *